United States Patent [19]

Ikegaya et al.

[11] Patent Number: 5,481,081
[45] Date of Patent: Jan. 2, 1996

[54] METHOD AND APPARATUS OF SYNTHESIZING DIAMOND IN VAPOR PHAASE

[75] Inventors: Akihiko Ikegaya; Naoji Fujimori, both of Hyogo, Japan

[73] Assignee: Sumitomo Electric Industries, Ltd., Osaka, Japan

[21] Appl. No.: 298,713

[22] Filed: Aug. 26, 1994

Related U.S. Application Data

[62] Division of Ser. No. 40,366, Mar. 30, 1993, abandoned.

[30] Foreign Application Priority Data

Mar. 30, 1992 [JP] Japan .................................. 4-106016

[51] Int. Cl.⁶ ...................................................... B23K 10/00
[52] U.S. Cl. .................... 219/121.48; 219/121.43; 219/121.44; 219/121.47; 219/121.49; 427/569; 156/345; 156/646
[58] Field of Search ...................... 219/121.43, 121.44, 219/121.48, 121.49, 121.52, 121.59; 315/111.51, 111.21, 111.31; 427/569; 156/345, 646

[56] References Cited

U.S. PATENT DOCUMENTS 3,714,390 1/1973 Foex et al. .
3,989,512 11/1976 Sayce .

FOREIGN PATENT DOCUMENTS 0388861 9/1990 European Pat. Off. .
61-25978 11/1986 Japan .
6433096 2/1989 Japan .
1172294 7/1989 Japan .
1179789 7/1989 Japan .
2248397 10/1990 Japan .

*Primary Examiner*—Mark H. Paschall
*Attorney, Agent, or Firm*—Cushman Darby & Cushman

[57] ABSTRACT

A DC plasma jet method enables us to synthesize diamond at a high speed by spraying an activated carbon-containing gas as a plasma jet to a substrate. Despite the high speed deposition, the method cannot synthesize a wide uniform diamond owing to the ununiformity of the jet and the restriction of sizes of torches. Uniform deposition of diamond on a wide substrate is a purpose of this invention.

More than two anode-nozzles and more than one plasma torch are utilized. They are disposed with their center lines crossing at a point. An inert gas or hydrogen gas are supplied in the torches in order to excite inner arc plasma jets. Then the torches are applied a negative DC voltage. The anode-nozzles are applied a positive voltage and are supplied with an inert gas, hydrogen gas or both an inert gas and hydrogen gas. Outer transferable plasma jets are formed between the cathodes of torches as cathodes and the nozzles as anodes. The plasma arc jets are integrated into a unified plasma flame. The nozzles and the torches are moved or rotated in order to enlarge the plasma formation areas. A carbon-containing gas is supplied to confluences of the plasma jets from the cathode-torches and the anode-nozzles from gas supplying nozzles.

11 Claims, 8 Drawing Sheets

METHOD AND APPARATUS OF SYNTHESIZING DIAMOND IN VAPOR PHAASE

This application is a division of Ser. No. 08/040,366 filed Mar. 30, 1993, now abandoned.

FIELD OF THE INVENTION

This invention relates to a method and an apparatus of synthesizing diamond in vapor phase. Especially, it relates to a vapor phase method and apparatus which enable us to make a wide diamond of high quality in a short time in vapor phase.

BACKGROUND OF THE INVENTION

This application claims the priority of Japanese Patent Application No. 106016/1992 filed Mar. 30, 1992, which is incorporated herein by reference.

Various methods for synthesizing diamond in vapor phase have been known. These methods are classified by the way how to dissolve and activate a material gas.
(1) Hot Filament CVD Method . . . activating a material gas by hot filament heated at a high temperature.
(2) Microwave Plasma CVD Method . . . activating a material gas by microwave plasma.
(3) DC plasma CVD Method . . . activating a material gas by DC hot plasma.
(4) DC Arc Plasma CVD method . . . activating a material gas by DC arc plasma.
(5) Are Plasma Jet CVD method . . . activating a material gas by are plasma jet utilizing DC plasma torch or RF plasma torch.
(6) Burner Method . . . activating a material gas by oxygen acetylene flame.

The inventors think that a favorable method for synthesizing diamond at high speed is the DC plasma jet method which utilizes DC plasma torches. This invention is an improvement of the DC plasma jet method. Many proposals have been presented with regard to DC plasma jet methods. They have advantages and drawbacks in any way. Prior methods will be explained in short.

(1) Japanese Patent Laying Open No.64-33096 (33096/1989)

A torch for plasma spraying was used for synthesizing diamond. A plasma torch has a cylindrical anode and a columnar cathode enclosed by the anode. A plasma jet is produced by the steps of applying a DC voltage between the cylindrical anode and the columnar cathode, supplying a carbon-containing gas, hydrogen gas and argon gas to a nozzle installed between the anode and the cathode, generating arc discharge, converting the gas into plasma and spurting the plasma with the discharge gas from the nozzle. This method utilizes untransferable, inner discharge. The gas for making plasma is a material gas including carbon itself. Namely, the gas to make plasma is not distinguished from the material gas. A material gas including carbon passes through a gap between the cathode and the anode. The nozzle ejects gases with so high speed that they form a jet flow. Furthermore, it utilizes hot plasma. The jet flow and the hot plasma allow the method to excel in high speed deposition. However, since the method makes a carbon-containing gas flow through a gap between the anode and the cathode, surfaces of electrodes mainly near an outlet are likely to be covered with carbon deposition. Deposition of carbon makes the arc discharge unstable. Stable discharge cannot hold in the torch owing to the carbon deposition for a long time.

Furthermore, this device would be insufficient to deposit diamond films with a wide area.

In order to solve the difficulty of the carbon deposition on the electrodes, Japanese Patent Laying Open No. 64-33096 had proposed an improvement of forbidding the carbon containing gas from flowing through an inner space of a plasma torch. Namely, such a gas without carbon flows in the nozzle and a carbon containing gas is forced to blow to the plasma jet from a side of the plasma jet stream. Since carbon does not pass through the inner space of the torch, the inner space is immune from carbon contamination. Although this improvement would be effective for a small plasma jet with slow velocity, other problems remains for a big, rapid plasma jet. Large inertia of the big, rapid plasma flow will prevent a centripetal flow of a carbon-containing gas from attaining to the central part of the plasma jet. Thus, the carbon containing gas cannot be effectively dissolved and activated. The improvement falls in full exploitation of a carbon-containing gas.

(2) Japanese Patent Laying Open No. 1-179789 (179789/1989)

A torch has a cathode at the center. A bore is perforated in the cathode through which a carbon-containing gas is supplied in the torch. The surface of an anode or the cathode will not be contaminated by carbon. However, since a gas outlet of the carbon-containing gas appears in plasma, carbon will deposit on the gas outlet. The deposition of carbon will unstabilize the state of discharge. As the size of the outlet is so narrow, a little deposition of carbon easily changes the state of discharge.

In general, a DC arc plasma jet method excels in the speed of synthesis of diamond. Some report says that the method will exhibit a maximum deposition speed of 100 µm/h of diamond. In spite of the high speed of deposition, it is insufficient to produce a wide diamond film. If a wide diamond cannot be synthesized, objects of the diamond will be confined and production costs will be raised. Besides, it suffers from the instability of the state of discharge owing to carbon deposition on the surfaces of electrodes. Thus, drawbacks of DC plasma jet methods, i.e. a narrow deposition area, and instability of discharge have not been solved yet.

A large plasma torch and big supply of power would enable us to obtain a wide diamond film. Someone attempted to enlarge a plasma torch. But since plasma is generated by arc discharge, enlargement of the plasma torch will accompany widening of the area of discharge. Widening of discharge will induce instability of arc discharge. Maintenance of large plasma jets requires a vast amount of gas supply. Restriction of gas supply confines the maximum size of the torch. Even if a single torch would be enlarged to the maximum, a deposition area more than 2 inches in diameter could not be obtained by the single torch.

Big supply of power would heat the electrodes vehemently and might melt them out. To avoid melting of the electrodes, they are usually cooled by letting water flow in inner spaces of the electrodes or blowing sheath gas to the surfaces of the electrodes. Restriction of cooling performance for the electrodes confines the maximum supply of power for them. Thus, the power cannot be increased over a limit determined by the cooling performance.

(3) Japanese Patent Laying Open No. 1-172294 (172294/1989)

A single plasma torch produces only a small diamond film with a narrow area. Enlargement of a torch is ineffective owing to the instability of discharge and the restriction of cooling performance. Then plural plasma torches of the same structure aligned side by side would be effective, since a big plasma stream would be obtained by the confluence of individual plasma streams. For example, Japanese Patent Laying Open No.1-172294 uses two equivalent torches aligned side by side. A bigger stream could be formed. However, this method combined two steams as it is. The density of plasma is not uniform but extremely irregular at the center or in the periphery. An irregular distribution of plasma in the combined stream will make a film with a large fluctuation in thickness or quality. Such an irregular film deposition resulted from primitive alignment of equivalent torches.

(4) Japanese Patent Laying Open No. 61-259778 (259778/1986)

All of prior art mentioned so far excite arc discharge in a single plasma torch and generate plasma in the torch. Such a plasma jet made by the isolated torches is called an untransferable, inner plasma jet. An untransferable plasma torch produces a high temperature and high speed plasma jet. But an ultrahigh temperature and high speed plasma jet are likely to melt electrodes down and forbid a longterm, continual operation of deposition. Inert gases are available for producing plasma. No carbon-containing gas could be used for a plasma-producing gas.

Another type of arc discharge held between plural torches has been devised in order to solve these difficulties. Japanese Patent Laying Open No.61-259778 installs a pair of a plasma torch which will act as an anode and another plasma torch which will act as a cathode in a vacuum chamber. Each torch has a core cathode, a first outer electrode and a second outer electrode for anodes. At first, inner plasma discharge is induced in individual torches by applying a DC voltage between the cathode and the anode of the individual ones. Then, the inner plasma discharge will be converted to an external plasma held between a torch as a cathode and another torch as an anode by the steps;

(a) Stopping applying voltage between the anode and the cathode of the torch acting as a cathode (a cathode-torch in short hereafter) for stopping discharge between the anode and the cathode of the cathode-torch, (b) Applying voltage by the same power supply which has been applied between the anode and the cathode of the cathode-torch, between the cathode of the cathode-torch and the anode of the anode-torch at the same time of step (a), (c) Stopping applying voltage between the anode and the cathode of the anode-torch for stopping the discharge between the anode and cathode of the anode-torch, (d) Producing a transferable, outer plasma jet between the cathode of the cathode-torch and the anode of the anode-torch, This method allows the torches to form a wide, transferable, outer plasma jet instead of a narrow untransferable plasma jet which is kept between a cathode and an anode of the same torch. In the transferable outer plasma jet, an arc occurring from a cathode of a cathode-torch passes through a nozzle between a first outer electrode and a second outer electrode of a cathode-torch, goes out from the torch, forms a hair-pin like arc-column and enters an anode point of an anode of an anode-torch. A beginning point on the cathode of the cathode-torch and an end point on the anode of the anode-torch of the transferable plasma jet are securely fixed. Fixation of the points stabilizes the arc column for a long time. Therefore, the instability of arc in the isolated, untransferable torch is resolved by the transferable jet. Japanese Patent Laying Open No.61-259779 has another feature. It has proposed a new torch having three electrodes, i.e. a central cathode, a first cylindrical anode and a second cylindrical anode which are coaxially disposed around the center line. Two separated spaces; a space between the cathode and the first anode and another space between the first anode and the second anode, are provided for a torch. Gases can be supplied to both of two separated spaces. Namely, an inert gas will be let flow in the first space between the cathode and the first anode in the cathode-torch for protecting the inner cathode from plasma, when a transferable outer plasma column has been once established. Similarly the inert gas will be let flow in the second space between the first and second anodes for protecting the inner anode of the anode-torch from plasma.

As mentioned so far, some methods for generating an outer plasma jet among plural torches have been already proposed. In the methods, individual torches must make individual discharge in themselves. The preparatory discharge is indispensable for inducing an outer discharge among the torches. If voltage were applied between the cathode of the cathode-torch and the anode of the anode-torch without preparatory plasma arcs, no outer discharge would happen. When a transferable, outer discharge has been established, the original, inner discharge in individual torches is turned off. They have an advantage that the electrodes are protected by the gas flow of inert gas during the outer discharge being kept.

(5) Japanese Patent Laying Open No.2-248397 (248397/1990)

An outer plasma jet is formed among plural torches also in the invention. Features will be explained here;

(a) Two plasma torches are disposed in a relation in which extensions of central axes of two torches meet at a point. An outer, transferable arc plasma is born between a cathode of a torch (cathode-torch) and an anode of another torch (anode-torch). A substrate body is placed at a point on extension of the central axial line of the cathode-torch. A diamond film will be grown on the substrate body.

(b) A torch has a three-fold, coaxial structure of electrodes. A cathode bar is mounted at the center. Two coaxial anodes enclose the cathode. Inner cylindrical anode is called a first outer electrode. Outer cylindrical anode is called a second outer electrode. Otherwise, the inner anode is simply called an anode, and the outer anode is called an outer electrode. Gas passageways are formed between the cathode and the first outer electrode and between the first outer electrode and the second outer electrode. Gas can flow in the passageways from the bottom ends to the front ends. The three-fold electrodes effectively contribute to protecting the electrodes against heat during the external discharge in action. A transferable, outer discharge spans a cathode of a cathode-torch and an inner anode of a anode-torch (first outer electrode). In the cathode-torch, the cathode is protected by letting inert gas flow in the first space between the cathode and the first outer electrode. In the anode-torch, the first outer electrode (anode) is protected by letting inert gas flow in the second space between the first outer electrode and the second outer electrode. Since inert gas contains no carbon, the electrodes are not contaminated by carbon deposition. It is preferable to let hydrogen gas flow in other gas passageways, i.e. the space between the first outer electrode and the second outer electrode of the cathode-torch. Hydrogen gas is unlikely to induce instability of discharge. Vapor-phase reaction of hydrogen gas would not bring about deposition on electrodes. Without such bad effects, hydrogen gas cools electrodes.

(c) Carbon-containing gas will be sprayed to the plasma jet from a separated nozzle.

Japanese patent Laying Open NO.2-248397 has succeeded in constructing a DC plasma jet apparatus in which carbon does not deposit on electrodes, an inert gas effectively protects anodes and cathodes and longterm, stable operation is realized by the improvements mentioned.

Inventors have devised a new plasma jet CVD method which can overcome the difficulties. It was filed on 9, Aug. 1991 (filing NO.3-225100 (225100/'91)). The CVD method utilizes plural plasma torches which are disposed face to face each other. Some of the torches act as cathodes. The others play a role of anodes. All the torches are independent plasma torches with a cathode bar, anodes and a inherent power source. All torches can ignite inner are plasma independently by applying a DC voltage between the electrodes from the individual power source. The are plasma is untransferable, inner plasma. After the inner plasma jets are fired, pairs of the inner plasma jets are coupled by assigning a torch as a cathode-torch and by assigning the other torch as an anode-torch. An outer plasma jet is produced between the cathode-torch and the anode-torch. The plasma jet is called an outer, transferable plasma are jet. Individual plasma jets are integrated into a big unified plasma jet flame. Then the torches are relatively moved or rotated in order to enlarge the unified plasma jet flame. Such a dynamical enhancement of the plasma flame is a feature of the former invention. A wide plasma flame has enabled a plasma CVD method to make a wide diamond film on a wide substrate body at high speed. This was an excellent invention.

As explained at first, the DC plasma jet method excels in high speed deposition but it cannot still conquer the difficulty of instability of discharge. Japanese Patent Laying Open No.61-259778 and No. 2-248397 have resolved the requirement for longterm stability of plasma are by replacing an untransferable, inner plasma are by a transferable, outer plasma are.

However, another important requirement for widening the formation area of diamond has not been resolved yet by these proposals. Besides the requirement for widening, these improvements have been still accompanied by another difficulty that a sufficient amount of carbon cannot be introduced into the middle part of plasma jet in the ease of a wide plasma jet, because a carbon-containing gas is sprayed from sides of the jet in order to avoid contamination of electrodes by carbon. Ununiform activation of a carbon-containing gas causes ununiform thickness of a film.

Our Japanese Patent Application No.3-225100 was an excellent method. However it has also drawbacks, because it uses bulky torches as anodes as well as cathodes for forming transferable plasma jets. The improvement produces outer, transferable plasma jets between cathode-torches and anode-torches, integrates the individual plasma jets into a unified plasma flame, and enlarges the plasma jet flame by rotating or moving the cathode-torches and the anode-torches. The method uses complete, full-functioning torches for producing and maintaining plasma arc jets. All members are genuine plasma torches. Some of the torches are assigned to cathodes. The other of the torches are assigned to anodes. In case of employing equivalent plasma torches, the roles for anode or cathode can be changed among them. All the torches can independently fire plasma jets. These were advantages of JPA No.3-225100.

However both of anode members and cathode members are plasma torches with complex structures. The whole of the apparatus was complex in structure, too heavy to convey and too expensive.

The drawbacks will further explained more in detail. An individual plasma torch has an cathode bar, plural outer electrodes (anodes) and a cooling device for the cathode bar. A cathode point which is a negative end point of an are on the cathode bar shall be protected by argon gas from hot plasma. Thus the plasma torch must have a double gas passageways structure. Therefore, the plasma torch is a very heavy, bulky and highly expensive apparatus. The large size of a front opening impedes the access to each other. The minimum distance between two torches is restricted by the large size. A considerable long distance prevents a pair of torches from making an outer transferable plasma jet easily, because an outer plasma is formed by bringing an inner plasma in contact with another inner plasma. When an outer plasma will be enlarged by moving or rotating the plasma torches, large, heavy torches hinder free, wide ranged movements. A little displacement is likely to induce collision between neighboring plasma torches. Furthermore, an accurate device for transferring or rotating plasma torches would be required. Since a plasma torch is heavy, such a transferring device will be bulky and heavy because it must support and transfer heavy torches with high preciseness.

SUMMARY OF THE INVENTION

A purpose of this invention is to provide a method and apparatus for synthesizing diamond with a wide area by utilizing a DC plasma jet method which is inherently superior in high speed of deposition. Another purpose of this invention is to provide a method and an apparatus for synthesizing diamond which is less expensive than the apparatus using plasma torches as anodes. Another purpose of this invention is to provide a method of synthesizing diamond which allows us to enlarge the size of plasma jet more freely than JPA No.3-225100.

This invention uses at least one plasma torch and plural nozzles in order to form outer transferable plasma arc jets. Plasma torches can fire a plasma arc independently. The plasma torches act as cathodes, when transferable plasma arcs are yielded. Therefore, the plasma torches are now called cathode-torches. On the contrary, nozzles are simple devices which cannot fire plasma by themselves. The nozzles act as anodes, when an outer transferable plasma arc is formed. Thus the nozzles are called anode-nozzles for clarifying the role. Initially the plasma torches fire individual plasma arcs by applying a voltage between their inherent anodes and a cathode. This is called an untransferable, inner plasma arc. Then, a plasma gas and a voltage are supplied to the nozzles. The voltage induces new discharge between the nozzles and the cathode-torches, since the nozzles are applied a positive voltage and the torches are applied a negative voltage. The discharge makes another plasma arc between the cathode-torches and the nozzles. Namely, the nozzles catch are plasma from the seed plasma in the cathode-torches. This is called a transferable, outer plasma are jet, because the plasma arc spans two parts. The number of the outer, transferable plasma arcs depends on the number of cathode-torches and anode-nozzles. Then all the transferable plasma arcs are integrated to an wider, unified plasma jet. Then, the unified plasma jet will be enlarged by displacing or rotating the nozzles or torches. Such a dynamical enlargement is one of the most conspicuous features of this invention.

This invention proposes a method for synthesizing diamond by decomposing and activating a material gas by DC arc plasma jets generated by a DC voltage applied between an anode and a cathode of a plasma torch and by spraying the activated plasma on a substrate body, comprising the steps of disposing at least one plasma torch having a cathode bar, outer electrodes as anodes positioned in coaxial relation, and gas passageways formed among the cathode bar and the outer anodes, plural anode-nozzles having an anode bar and an outer cylinder and gas supplying nozzles in a relation where the cathode-torches and any of the anode-nozzles are not aligned along a straight line nor directed in parallel with each other, but extensions of the cathode-torches and extensions of the anode-nozzles meeting at a point, the cathode-torch being able to decompose and activate material gas, the anode-nozzles being able to eject gas, the gas supplying nozzles being able to spurt a material gas, the directions or positions of the cathode-torches and the anode-nozzles being adjustable, letting an inert gas or a mixture of an inert gas and hydrogen gas flow in the passageways of the cathode-torches, applying an RF superposed DC voltage between the cathode bar and outer anode of the cathode-torches for inducing discharge therebetween, generating an inner, untransferable arc plasma jet in the cathode-torches, letting an inert gas flow in the anode-nozzles, bringing the anode-nozzles in contact with the plasma jet generated by the cathode-torches, equalizing the voltage of the anode bars of the anode-nozzles with the voltage of the outer anodes of the cathode -torches for applying DC voltage between the anode bars of the anode-nozzles and the cathode bars of the cathode-torches, insulating the outer anodes of the cathode-torches from the anode-nozzles, forming outer, transferable arc plasma jets between the anode bars of the anode-nozzles and the cathode bars of the cathode-torches, unifying plural outer, transferable arc plasma jets into an integrated plasma jets spanning the cathode-torches and the anode-nozzles, extinguishing the inner, untransferable plasma arcs in the cathode-torches, enlarging the integrated outer, transferable arc plasma jets by displacing or rotating the anode-nozzles and the cathode-torches, spurting a carbon-containing gas or a mixture of hydrogen gas and a carbon-containing gas from the gas supplying nozzles upon sides of the integrated plasma jet, spraying the integrated plasma jet on the substrate body positioned in stream of the plasma jet, and depositing diamond synthesized in vapor phase reaction on the substrate body.

Instead of the untransferable, inner plasma jets, this invention makes transferable, outer plasma jets between torches and nozzles. A seed plasma is of course produced by a plasma torch. but the seed plasma ignites outer plasma arcs between the torch and the nozzles which are supplied with discharge gas and are applied a positive voltage. Such anode-nozzles have very simple structures. The anode-nozzles are inexpensive and light. They dispense with inherent power sources.

The transferable plasma jets are associated in a wider plasma jet. Then, the associated, wide plasma jet is enlarged by displacing or rotating plasma torches and anode nozzles. Such a dynamical expansion of plasma jet is another one of the features of this invention.

Only an inert gas or hydrogen gas passes through the passageways in plasma torches. Electrodes of torches are fully immune from carbon deposition. A material gas containing carbon does not pass in the torches.

A carbon-containing gas is spurted by the nozzles to the confluences of the plasma jets yielded by the cathode-torches and the plasma jets yielded by the anode-nozzles. Since sections of the plasma jets are not so large, the carbon-containing gas can be penetrated uniformly in the plasma jets. After the plasma jets have inhaled enough carbon, all plasma jets unite with together into an associated jet. The associated jet is a wide jet which could not be obtained by any prior art.

It is preferable that the number of nozzles for spurting a carbon-containing gas should be equal to the number of confluences of plasma jets from anode-nozzles and plasma jets from cathode-torches.

For example, if the number M of cathode-torches is 1 and the number N of anode-nozzles is 3, the number of confluences is three. In this case, three gas supplying nozzles should be used preferably.

If two cathode-torches (M=2) and two anode-nozzles (N=2) are installed, the plasma jets make four confluences. It is desirable to provide four gas supplying nozzles for spurting a carbon-containing gas into the confluences.

However, at least two gas supplying nozzles placed at symmetrical position are enough to spurt a carbon-containing gas into the plasma jets uniformly in general.

In short, this invention makes individual torches produce inner, untransferable discharge at first. Then, the inner, independent discharge is converted into outer, transferable plasma jets between the cathode-torches and the anode-nozzles by special operations. Finally, the plasma formation area is enlarged by displacing or rotating the anode-nozzles and the cathode-torches.

The steps will be explained more in detail. Transferable, outer plasma jets between M plasma torches and N anode-nozzles can be formed by the following methods;

(1) One cathode-torch and plural anode-nozzles yield transferable, outer plasma jets therebetween. (M=1, N≧2)

(2) Plural cathode-torches and the same number of anode-nozzles yield transferable, outer plasma jets therebetween. (M≧2, N= M)

(3) Plural cathode-torches and plural anode-nozzles more than torches yield transferable plasma jets therebetween. (M≧2, N> M)

In any cases, sum of the cathode-torches and anode-nozzles is more than three (M+N≧3). In common, transferable plasma jets will be formed by the following steps. In an initial disposition, extensions of central axis of cathode-torches meet favorably with extensions of central axes of anode-nozzles at a point. Namely, the anode-nozzles and the cathode-torches lie initially on two imaginary cones which face together at their tops. The distance between the anode-nozzles and the cathode-torches is short. At first, inner, untransferable plasma jets are formed in individual cathode-torches by applying a (RF superposed) DC voltage between the outer electrodes (anodes) and the cathode bar of the same torches. Secondly, transferable arc plasma jets between cathode-torches and anode-nozzles are formed by applying the DC voltage between pertinent electrodes of the torches. Then individual outer, transferable plasma jets are integrated in a unified plasma jet flame. Finally, the area of the plasma jet flame is widened by displacing or rotating the anodes or/and the torches. This invention features such dynamical widening of the plasma jet area.

In prior art mentioned before, Japanese Patent Laying Open No.61-259778 and No.2-248397 have proposed transferable, outer plasma between two plasma torches. These proposals correspond to the simplest case of M=1 and N=1. Since the outer plasma is only one, it is not effective to widen the plasma area. They had only one confluence of plasma jets from an anode-nozzle and a cathode-torch.

This invention features an inequality of M+N>3 with regard to the number M of cathode-torches and the number N of anode-nozzles. The number of confluences of plasma jets from the cathode-torches and plasma jets from the anode-nozzles is at most MN in a good disposition. The inequality M+N≧3 signifies more than two confluences. As the plasma jets have more than two confluences, the area of plasma jets is bigger than the case of M=1 and N=1. The more the confluences increase, the wider the plasma jet area of associated plasma becomes. This is a geometric increment of plasma area by increasing the number of anode-nozzles and cathode-torches. Furthermore, this invention enlarges the plasma area by moving or rotating the torches. This is a dynamical increment of the plasma area. Geometric increment and dynamic increment characterize this invention. This invention allows us to synthesize a diamond film of a large area by spraying a wide plasma jet to a substrate body.

The plasma jet area can be enlarged by moving or rotating anode-nozzles and cathode-torches in different modes, e.g. in the case of one cathode-torch and plural anode-nozzles (M=1, N≧2).

(1) Parallel transference of anode-nozzles along their central axes in the direction of receding from the cathode-torch,
(2) Parallel transference of the cathode-torch along its central axis in the direction of receding from the anode-nozzles,
(3) Rotation of the anode-nozzles in the direction of making the extensions of the central axes recede from the cathode-torch,
(4) Rotation of both the cathode-torch and the anode-nozzles in the directions of making the extensions of the central axes deviate from the initial confluence 0. All modes will be effective to enhance the plasma formation area. In practice, some of four modes will be utilized at the same time. In the case of plural cathode-torches (M≧2, N≧2), besides modes (1) to (4), other modes are also available.
(5) Parallel transference of the cathode-torches in the direction of receding together,
(6) Rotating the cathode-torches in the direction of enlarging the associated plasma area.

This invention forbids a carbon-containing gas from passing through the passageways of torches. Thus, surfaces of electrodes of plasma torches are not contaminated by carbon deposition. Gas nozzles are provided near the confluences of plasma jets for spurting a carbon-containing gas to the confluences of the cathode-torch jets and anode-nozzle jets. As mentioned before, the plasma torches are moved or rotated at the final stage for enlarging plasma jets. The displacement of torches accompany deviation of the confluences. Therefore, the nozzles for spurting a carbon-containing gas should be displaced according to the displacement of the confluences in order to spurt a carbon-containing gas to optimum spots in the plasma jets. Thus, it is preferable to provide the gas nozzles with an apparatus for displacing the nozzles.

Functions of this invention will be explained. Prior art had proposed an apparatus having a cathode-torch and an anode-nozzle for producing an outer, transferable plasma jet with one confluence (M=1, N=1). This invention uses more than three plasma torches. An outer plasma jet is generated between the cathode of a cathode-torch and the anode of an anode-nozzle (first outer electrode). The number H of cathode-torches is not necessarily equal to the number N of anode-nozzles. A case of M=1 and N≧2 is allowable. Another case of M≧2 and N=1 is also available. Of course, in general, such a case of M≧2 and N≧2 is possible.

[1] the case of single cathode-torch and plural anode-nozzles (M=1, N≧2)

The anode-nozzles should preferably be arranged at positions which are rotationally symmetric to the extension of the central axis of the cathode-torch and in which the extensions of central axes of the anode-nozzles meet at a point along the central axis of the cathode-torch. In the mode, the cathode-torch and the anode-nozzles form N confluences. Gas supplying nozzles for spurting a carbon-containing gas or a carbon-hydrogen-containing gas to N confluences should be installed. This is a static disposition at an initial state. Preferably the number of gas supplying nozzles is N. When outer plasma jets are turned on, the plasma jet area is enlarged by moving or rotating the anode-nozzles and the cathode-torch. Movement of the nozzles and the torch accompanies the displacement of confluences. Positions and directions of the gas supplying nozzles should be change in order to spurt a carbon-containing gas to optimum positions of the jets.

More detailed explanation is given now in the same case of M=1 and N≧2. The central axis of the cathode-torch is denoted by z-axis. The point at which the extensions of all the torch and the nozzles meet is assigned to the origin O of coordinate. P is the center of the cathode-torch and $Q_1, Q_2, \ldots$ are centers of anode-nozzles. Assuming $OP=g$, $OQ_1=OQ_2=OQ_3=\ldots=h$, $<POQ_1=\Theta$ and $2\pi/N=\Phi$, centers of the cathode-torch and the anode-nozzles are expressed by;

| cathode-torch | $P(0, 0, g)$ | (1) |
| anode-nozzle | $Q_1$ (h sin$\Theta$cos$\Phi$, h sin$\Theta$sin$\Phi$, h cos$\Theta$) | (2) |
| | $Q_2$ (h sin$\Theta$cos2$\Phi$, h sin$\Theta$sin2$\Phi$, h cos$\Theta$) | (3) |
| | $Q_3$ (h sin$\Theta$cos3$\Phi$, h sin$\Theta$sin3$\Phi$, h cos$\Theta$) | |
| | $Q_N$ (h sin$\Theta$, 0, h cos$\Theta$) | (4) |
| Directions of the torch and the anode-nozzles are expressed by unit vectors $p, q_1, q_2, \ldots$ | | |
| cathode-torch | $p(0, 0, -1)$ | (5) |
| anode-nozzle | $q_1$ ($-$sin$\Theta$cos$\Phi$, $-$sin$\Theta$sin$\Phi$, $-$cos$\Theta$) | (6) |
| | $q_2$ ($-$sin$\Theta$cos2$\Phi$, $-$sin$\Theta$sin2$\Phi$, $-$cos$\Theta$) | (7) |
| | $q_N$ ($-$sin$\Theta$, 0, $-$cos$\Theta$) | (8) |

Of course in the initial state, position vectors and direction vectors of the torches are antiparallel.

[2] the case of plural cathode-torches and plural anode-nozzles

The cathode-torches and the anode-nozzles should be arranged along generating lines on two imaginary cones facing each other. Peak points of the cones coincide at a point. However, if M=N, any plane including an anode-nozzle and z-axis should not coincide with any plane including a cathode-torch and z-axis. Namely, for N anode-nozzles and N cathode-torches, a unit angle $\phi$ is defined by $\phi=2\pi/2N=\pi/N$.

The center line of the imaginary cones is z-axis in the case. The inclination angle of the cathode-torches to z-axis is denoted by $\theta$ and the inclination angle of the anode-nozzles to z-axis is denoted by $\Theta$. The centers of anode- and cathode-torches are represented by;

1st cathode-torch $P_1$ (g sin$\theta$cos $\phi$, g sin$\theta$sin$\phi$, g cos$\theta$) (9)

1st anode-nozzle $Q_1$ (h sinΘcos2φ, h sinΘsin2φ, h cosΘ)   (10)

2nd cathode-torch $P_2$ (g sinθcos3φ, g sinθsin3φ, g cosθ)   (11)

2nd anode-nozzle $Q_2$ (h sinΘcos4φ, h sinΘsin4φ, h cosΘ)   (12)

If M=N, such a symmetric arrangement is desirable. Even if M≠N, a symmetric arrangement can be available, when M and N have a large greatest common divisor.

In these dispositions of the cathode-torches and the anode-nozzles, at first inner plasma jets are yielded in individual cathode-torches. Secondly, the individual plasma jets are converted into outer transferable plasma jets between the cathode-torches and some of the anode-nozzles. The outer plasma jets are integrated into a unified plasma jet flame. Finally, the integrated plasma jet area is enhanced by moving the torches and the nozzles. Various modes for enlarging the plasma jet area are available as mentioned before.

(1) Parallel transference of anode-nozzles along their center lines to the direction of receding from the cathode-torch,
(2) Parallel transference of cathode-torches along their center lines to the direction of receding from the anode-nozzle.
(3) Inclining anode-nozzles for letting the extensions of the center lines deviate from cathode-torches,
(4) Rotating anode-nozzles with the extensions of center lines of anode-nozzles deviating from the cross point O.

Some pertinent modes shall be selected for enlarging the plasma area. Modes 1 to 4 are pertinent for the case of M=1 and N≧2. Other cases have equivalent modes for moving the torches.

Mode 1 moves anode-nozzles in parallel along their axes for receding from origin O (confluence of jets), which corresponds to increase of h in Eqs.(2) to (4). Mode 2 which moves cathode-torches to the directions of receding from origin O corresponds to increase of g in Eq.(1). Mode 3 does not move anode-nozzles in parallel, but changes direction vectors by reducing Θ in Eqs.(6) to (8). Mode 4 changes angular parameters Φ or 2Φ to Φ+ε or 2Φ+ε, where ε is a small angle. Besides the change of Φ, Θ may be reduced.

If more than two cathode-torches are used (M≧2), another mode of moving cathode-torches in the directions for receding each other becomes available. This mode corresponds to enlarging the imaginary cone which determines the positions and directions of the cathode-torches. Namely, in Eq. (9), g sin θ cos φ shall be enhanced to g sin θ cos φ×α and g sin θ sin φ shall be enhanced to g sin θ sin φ×α (α>1).

On the contrary, another mode for enlarging the plasma area by inclining the cathode-torches toward the directions in which the imaginary cones diminish is also applicable. In the mode described by Eqs.(9) to (12), the crossing point of extensions of the anode-nozzles is displaced by -β in z-direction. At the same time, the inclination angle θ between z-axis and cathode-torches is reduced.

Besides the movement or rotation of torches, the plasma jet area can be adjusted by the following parameters;
(a) Shape of nozzle parts of the cathode-torches, anode-nozzles and gas supplying nozzles,
(b) Gas flux ejected from the cathode-torches, anode-nozzles and gas supplying nozzles,
(c) Component of the gas for producing plasma,
(d) Electric power for maintaining plasma,
(e) Pressure for producing plasma jets,
(f) Shape, position of outlet, and gas flux of a carbon-containing gas.

Advantages of this invention will now be explained.

(1) The method and apparatus for producing diamond of this invention allow us to make a large plasma jet area by producing inner untransferable plasma jets, converting them to outer transferable plasma jets and associating them in a united one.
(2) Besides the static enlargement of plasma jet area, this invention further widens the plasma area by dynamical operations. The outer, transferable plasma jet is further enlarged by parallel transference or rotation of torches in the direction of receding each other or in the directions in which center lines of torches deviate from the initial crossing point.
(3) If a carbon-containing gas flowed in passageways of plasma torches, electrodes of the torches would be contaminated by carbon deposition, which would unstabilize the discharge. Prior art have failed to solve the instability of discharge. This invention forbids a carbon-containing gas from flowing in passageways of the plasma torches. Only an inert gas or hydrogen gas or a mixture of an inert gas and hydrogen gas flows in the torches. Electrodes of the torches are fully immune from carbon contamination. The difficulty of instability of discharge is solved. A carbon-containing gas shall be spurted from other nozzles to the confluences of outer plasma jets. Freedom from carbon deposition allows torches to keep plasma jets stable for a long time.
(4) Carbon-gas-supplying nozzles spurt a carbon-containing gas to the confluences of plasma jets from one pair of anode-nozzle and cathode-torch. Since the section of the plasma jets is small at the confluences, the carbon-containing gas can uniformly attain to central portion of jets. The plasma gas contains uniformly-distributed carbon. The uniformly carbon-distributed plasma jet enables us to synthesize a wide diamond film with a uniform property on a wide substrate body.
(6) This invention features flexibility. The plasma jet area can unlimitedly be expanded by increasing the numbers of cathode-torches and anode-nozzles.
(7) This invention allows a plasma jet method to form a wide, uniform diamond film on a wide substrate body without impairing the most conspicuous advantage of plasma jet method, i.e. rapid synthesis. This is the most important advantage of this invention.
(8) Formation of an outer, transferable arc plasma requires cathode-members and anode-members. Aforementioned Japanese patent Application NO. 3-225100 employed plasma torches both for cathode-members and anode-members. Too many plasma torches forced the apparatus to become too bulky. Heavy torches imposed heavy burden on the device for moving or rotating the torches. Too many power sources heightened the parts costs. Large size of the torches decreased the freedom of displacement or rotation. On the contrary, this invention simply employs a nozzle as an anode which is light in weight, easy to manufacture. Furthermore the conversion from a torch to a nozzle simplifies the structure of the anode-members and the moving or rotating devices therefor and widens the scope and freedom of displacement and rotation.

DETAILED DESCRIPTION OF EMBODIMENTS

EMBODIMENT 1 (M=1, N=3)

Figure 1:
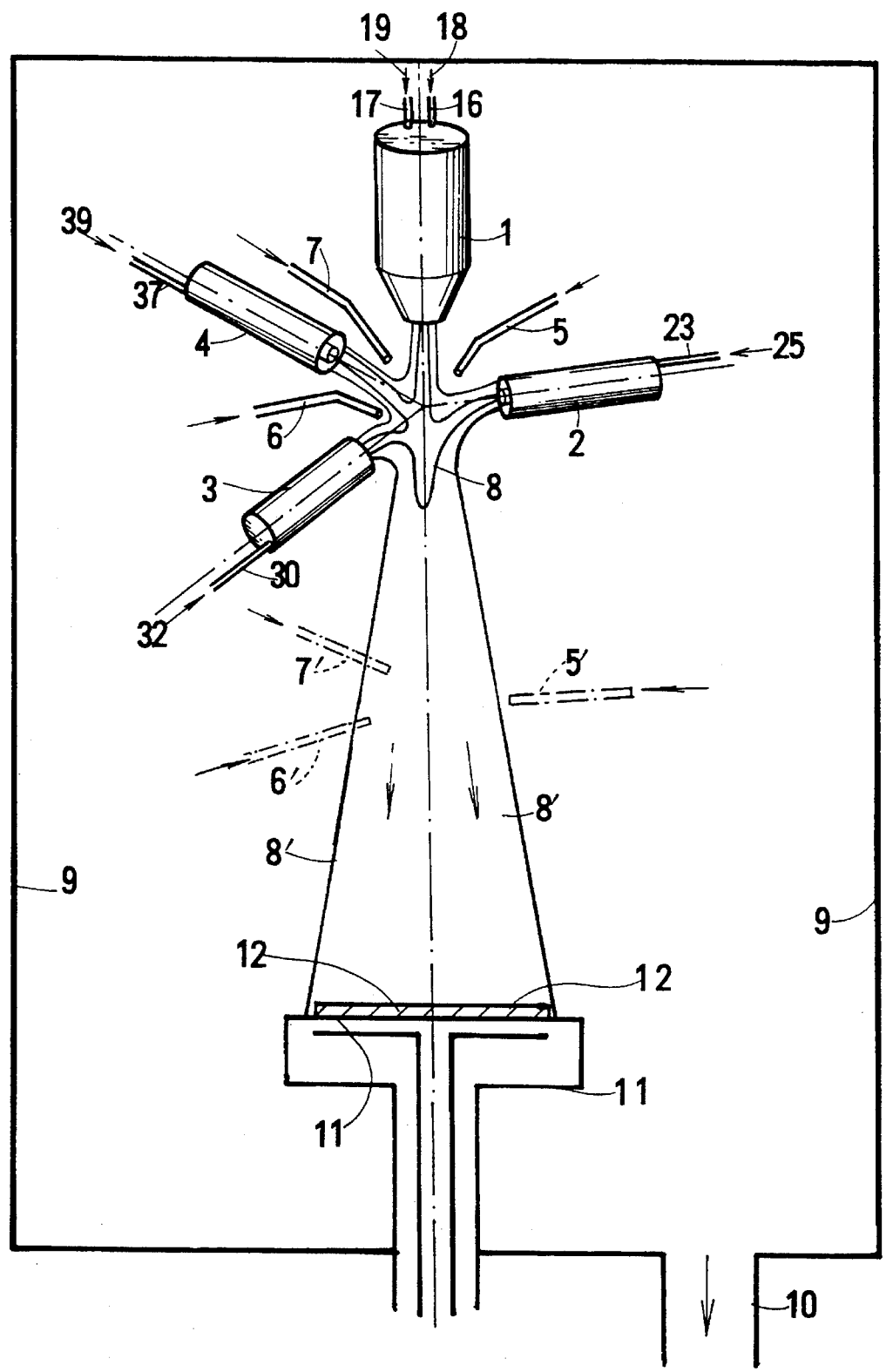
FIG. 1 is a schematic view of a first embodiment utilizing one cathode-torch and three anode-nozzles.

Embodiment 1 uses one cathode-torch and three anode-nozzles. FIG. 1 demonstrates an apparatus for putting this invention into practice. A plasma torch and nozzles are shown in perspective manner for clarifying the relation of the torch and the nozzles. The plasma torch (1) has a cathode and anodes in coaxial relation therein which can yield plasma by generating arc discharge. Introducing gas into passageways from a rear end of the plasma torch, the torch excites the gas by arc discharge into plasma, and gushes a plasma jet from a front nozzle part. The torch (1) is used as a cathode when an outer, transferable plasma is formed. Thus, the plasma torch (1) is called a cathode-torch so as to clarify the function.

Only an inert gas or a mixture of an inert gas and hydrogen gas flows in the passageways of the cathode-torch. No carbon-containing gas passes through inner spaces of the cathode-torch. The cathode-torch is immune from carbon deposition.

Three nozzles (2), (3), and (4) which can act as electrodes are positioned at the positions rotationally symmetric with regard to the central line of the cathode-torch (1). The nozzles (2), (3) and (4) will act as anodes when an outer, transferable plasma jets arc formed. Thus, the nozzles are now called as anode-nozzles. Use of anode-nozzles instead of anode-torches features this invention. Each anode-nozzle has a central electrode bar and a cylinder enclosing the electrode. Gas can be supplied into an inner space between the central electrode and the outer cylinder of each anode-nozzle.

Set of gas supplying nozzles (5), (6) and (7) or another set of gas supplying nozzles (5'), (6') and (7') are installed around a plasma jet flame. Selection of an upper position or a lower position depends on the size of a plasma jet flame. If the plasma jet flame is less than 50 mm in diameter, the lower position of the nozzles should be selected. Lower-positioned gas nozzles (5'), (6') and (7') can uniformly inject a carbon-containing gas into the associated plasma jet flame, because the flame is still thin enough for the gas flow gushing from the sides. If the plasma jet flame (8') is more than 50 mm in diameter, the upper position of the gas supplying nozzles should be chosen for injecting a carbon-containing gas into the confluences of plasma jets from the cathode- and anode-nozzles. At the confluences the plasma jet is still thinner than the associated plasma jet flame (more than 50 mm). Thus, carbon can be injected into an innermost position of the plasma jet. Once uniformly-distributed carbon will be redistributed uniformly in the associated flame. In FIG. 1, an upper set of gas supplying nozzles is shown by (5), (6) and (7). The gas supplying nozzle (5) faces to the confluence of the gases from the cathode-torch (1) and the anode-nozzle (2). The gas supplying nozzle (6) faces to the confluence of the gases from the cathode-torch (1) and the anode-nozzle (3). The gas supplying nozzle (7) corresponds to the last confluence of the gases from the cathode-torch (1) and the anode-nozzle (4).

Outer, transferable plasma arcs (8) are produced between the cathode-torch (1) and the anode-nozzles (2), (3) and (4). Individual transferable plasma arcs are associated with a bigger plasma jet flame (8'). The plasma torch (1), the anode-nozzles (2) to (4) and the gas supplying nozzles (5) to (7) or (5') to (7') are furnished in a vacuum chamber (9). The vacuum chamber (9) has a vacuum exhaust outlet (10) from which the chamber (9) can be made vacuous. A cooled susceptor (11) is installed below the plasma jet flame (8') in the vacuum chamber (9). A substrate body (12) is placed on the susceptor (11). A diamond film will be grown on the substrate body (12). Since the hot plasma jet flame (8') launches the substrate body (12), the susceptor (11) must be cooled. In the embodiment, the susceptor (11) is effectively cooled by water.

Embodiment 1 has a cathode-torch (1) lying on z-axis, three anode-nozzles (2), (3) and (4) furnished at positions 3-fold rotationally symmetric around z-axis with a center angle of 120° Inclination angle Θ of the anode-nozzles to z-axis is between 90° and 60°. In general a desirable range of the inclination angle Θ of the anode-nozzle is 10° to 110°.

Figure 2:
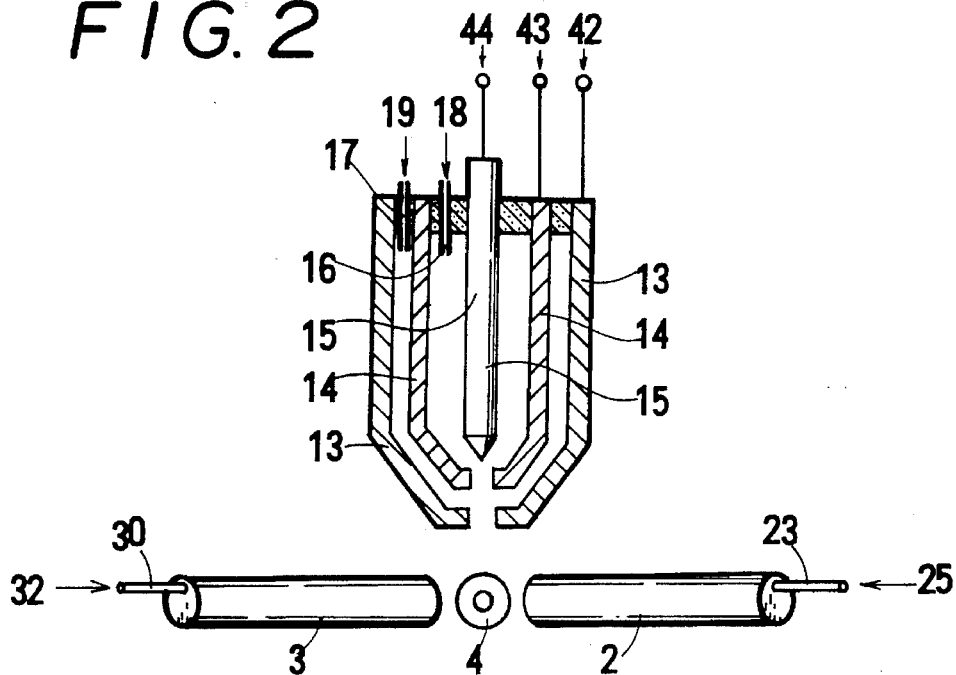
FIG. 2 is a side view of the cathode-torch and anode-nozzles only with the cathode-torch shown in section.
Figure 3:
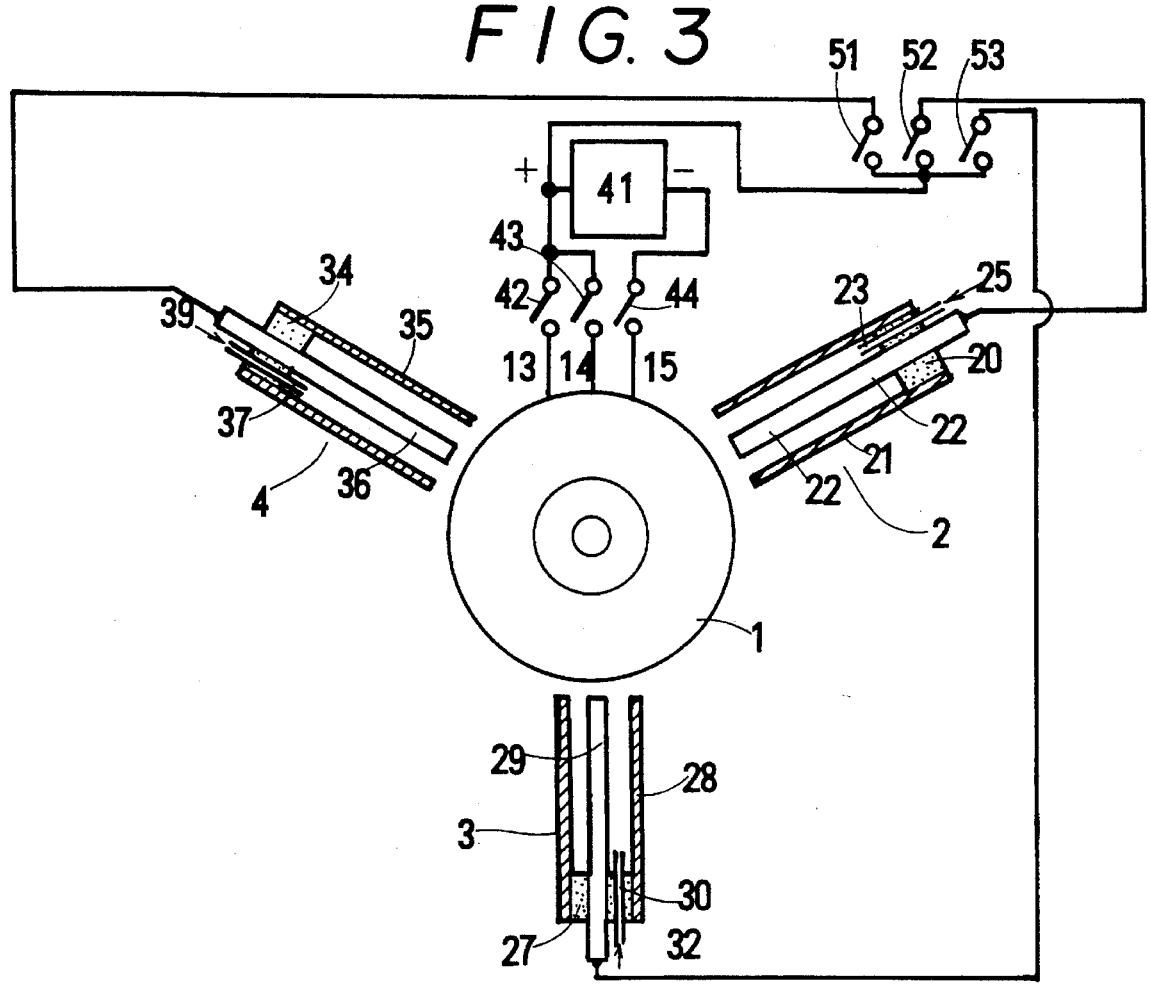
FIG. 3 is a sectional view of anode-nozzles with electric circuits for connecting torches and power sources.

FIG. 2 shows an example of Θ=90°. This is a side view of torches. The central cathode-torch (1) is shown by a section view in order to demonstrate an inner structure of the cathode-torch (1). FIG. 3 demonstrates sections of the anode-nozzles (2), (3) and (4), and electric circuits for connecting a power source (41) to electrodes of the torch and the nozzles. Three anode-nozzles are equivalent nozzles. The cathode-torch (1) is larger than the anode-nozzles in weight and size.

The cathode-torch (1) is a cylindrical device having three electrodes in coaxial relation; from outer to inner, a second outer electrode (13), a first outer electrode (14) and a cathode bar (15). The outer electrodes are assigned to anodes, when an inner plasma is formed. These electrodes are separated by insulators. The cathode bar (15) is made from tungsten (W). The outer electrodes (13) and (14) are made from copper (Cu). In practice, these electrodes (13) and (14) have double walls between which cooling water flows to cool them. The cathode-bar (15) is cooled near its rear end. The first outer electrode (18) and the second outer electrode (14) taper away at a front end to be a narrow outlet. A first gas inlet (16) is provided by piercing a rear insulator of the cathode-torch (1) for introducing a gas (18) into a passageway between the cathode bar (15) and the second outer electrode (14). Similarly a second gas inlet (17) is provided by piercing the rear insulator in order to introduce a gas (19) into a passageway between the first outer electrode (14) and the second outer electrode (13). A gas (18) and another gas (19) are introduced into the passageways of the torch (1). These gases are gases for producing plasma.

The anode-nozzles (2), (3) and (4) have a simpler structure than the cathode-torch (1) has. The anode-nozzle (2) is equipped with an insulator (20) at a rear end, a cylinder (21) and an anode bar (22) which are coaxially supported at rear ends by the insulator (20). A gas inlet (23) piercing a rear end of the insulator (20) introduces a gas (25) for producing plasma. The second anode-nozzle (3) is provided with an insulator (27) at a rear end, a cylinder (28) and an anode bar (29) which are held at rear ends by the insulator (27) in coaxial relation. A gas inlet (30) introduces a gas (32) for producing plasma through the insulator (27). The anode-nozzle (4) has an insulator (34) at a rear end, a cylinder (35) and an anode bar (36) which are held in coaxial relation at rear ends by the insulator (34). A gas (39) for exciting plasma is introduced from a gas inlet (37) piercing the insulator (34).

With regard to cooling of the anode-nozzles (2), (3) and (4), the anode bars (22), (29) and (36) are made from copper (Cu). The copper anode bars have inner passages in which cooling water flows for cooling the copper anode bars. The anode-nozzles are strongly heated, since voltage is applied between the anode bars and the cathode-torch and an transferable plasma arc is formed therebetween. If the outer cylinders (21), (28) and (35) are made from copper, they must be cooled. The voltage of the metal outer cylinders may be a floating level. If the outer cylinders are made from ceramics or high-melting point metals, they will dispense with cooling devices. The cathode-torch (a plasma torch) and the anode-nozzles (2), (3) and (4) let a gas flow in passageways between the cathode and the anode or between the anode bar and the outer cylinder for producing plasma jets. The gas is an inert gas or a mixture of an inert gas and hydrogen gas, where an inert gas means Ar, Ne, He or Kr. No carbon-containing gas flows in the cathode-torch (1) or the anode-nozzles (2),(3) and (4).

The cathode-torch (1) is provided with a power source (41) which gives a DC voltage or a DC voltage superposed with an RF voltage to the electrodes of the torch. Superposition of RF voltage facilitates plasma arc generation. The anode-nozzles have no inherent power source. When a plasma arc starts in the torch, the power source (41) supplies an RF-superposed DC voltage between the cathode bar (15) and the first outer electrode (4) of the torch (1). Since the power source (41) is substantially a DC source, it has a positive pole (denoted by +) and a negative pole (denoted by −). The negative pole of the power source (41) is connected via a switch (44) to the cathode bar (15). The positive pole is connected via a switch (42) to the second outer electrode (13) and via a switch (43) to the first outer electrode (14). Double anodes (outer electrodes) of the cathode-torch (1) ensure that the inner plasma arc will be converted into an outer arc plasma and will facilitate the protection of electrodes by allowing a gas to flow in the passageway between the first and second outer electrodes. Therefore, two outer electrodes (13) and (14) are alternately applied with voltage by turning the switch (42) or (43) on or off.

The anode-nozzles have no eigen power source individually but are connected to the positive electrode of the power source (41) through the switches (51), (52) and (53). Besides the torch, nozzles and power source, devices for supporting, displacing or rotating the cathode-torch, anode-nozzles and gas supplying nozzles are installed in the vacuum chamber but they are not shown in figures.

At first the cathode torch (1) which is a plasma torch will produce an inner, untransferable plasma jet. The seed inner plasma will be converted to an outer, transferable plasma jet between the cathode-torch (1) and the anode-nozzles. Then the outer, transferable plasma jet will be enlarged. The torches and the switches as well as nozzles will be operated along with the following manners.

[1] In the vacuum chamber (9), a substrate body (12) is firmly fixed upon a cooled susceptor (11) in order to ensure sufficient heat transference therebetween. The cooled susceptor (11) is at first displaced at a lower position. The inner space of the vacuum chamber (9) is made vacuous down to a pressure less than $1\times10^{-3}$ Torr. Then argon gas is introduced into the cathode-torch (1) through the gas inlets (16) and (17). The switches (43) and (44) are turned on. The other switches (42), (51), (52) and (53) are left off.

[2] When the pressure in the vacuum chamber (9) attains about 600 Torr, the power source (41) of the cathode torch (1) is actuated. An RF-superposed DC voltage is supplied between the cathode bar (15) and the first outer electrode (14). An inner, untransferable plasma arc is formed. A short distance between the electrodes (15) and (14) facilitates turning-on of a seed plasma.

[3] The switch (42) is turned on. The switch (43) is turned off. Anode voltage transfers from the first outer electrode (14) to the second outer electrode (13). Inner plasma is transferred between the cathode bar (15) and the second outer electrode (13). This transference alleviates the difficulty of the conversion from inner plasma to outer plasma. In the step, only the cathode-torch (1) has an inner untransferable arc plasma jet.

[4] The anode-nozzles (2), (3) and (4) have no eigen power source and they are not plasma torches. Thus the anode-nozzles cannot produce inherent arc plasma. But voltage can be applied to the anode-nozzles and gas can be supplied in the inner spaces of the anode-nozzles. The anode-nozzles (2), (3) and (4) can catch fire from the plasma flame of the cathode-torch. Preparatorily gases (25), (32) and (39) for plasma formation are introduced from the gas inlets (23), (30) and (37).

[5] Outer, transferable plasma are will be built up. First, an outer, transferable are plasma will be produced between the cathode-torch (1) and the first anode-nozzle (2). The seed plasma are of the cathode-torch (1) is enlarged by increasing the power of the power source (41). The supply of argon gas to the anode-nozzles (2) is once stopped. The switch (52) is closed. The voltage of the anode bar (22) of the anode nozzle (2) becomes the same as the voltage of the second outer electrode (13) of the cathode-torch (1). Namely, voltage is applied between the cathode bar (15) of the cathode-torch (1) and the anode bar (22) of the anode-nozzle (2). In necessary, the anode-nozzle (2) should be moved nearer toward the cathode-torch (1). The switch (42) is turned off and argon gas is supplied to the anode-nozzle (2) again. A plasma arc is produced between the anode bar (22) of the anode-nozzle (2) and the cathode bar (15) of the cathode-torch (1). Namely, the anode-nozzle (2) catches the plasma arc. Therefore, an outer, transferable arc plasma is produced between the cathode-torch (1) and the anode-nozzle (2).

[6] Similar operation is repeated on the second anode-nozzle (3). The output power of the power source (41) is gradually raised. Supply of argon gas into the anode-nozzle (3) is once stopped. The switch (53) is turned on and argon gas is supplied again. Furthermore, the anode-nozzle would be displaced nearer to the cathode-torch (1), if necessary. A second outer, transferable plasma arc is produced between time cathode-torch (1) and the anode-nozzle (3).

[7] Similar operation is repeated on the third anode-nozzle (4). The output power of the power source (41) is gradually raised. Supply of argon gas into time anode-nozzle (4) is once stopped. The switch (51) is turned on and argon gas is supplied to the anode-nozzle (4) again. Furthermore, the anode-nozzle would be displaced nearer to the cathode-torch (1), if necessary. A third outer, transferable plasma arc is produced between the cathode-torch (1) and the anode-nozzle (4). Thus, three transferable arc plasma jets are excited between the cathode-torch (1) and the anode-nozzles (2), (3) and (4). In this invention, only the cathode-torch can ignite a seed plasma arc. Anode-nozzles cannot produce a plasma arc but catch a plasma arc from the seed plasma.

Then, the apparatus has three arc plasma flames, i.e. an outer plasma flame between the cathode-torch (1) and the anode-nozzle (2), another outer plasma flame between the cathode-torch (1) and the anode-nozzle (3), the other outer plasma flame between the cathode-torch (1) and the anode-nozzle (4).

[8] Three outer arc plasma flames finally remain between the anode bars (22), (29), (36) and the cathode bar (15) of the cathode-torch (1).

Operations [1] to [8] mentioned above enable us to produce a wide, outer arc plasma jet with a large sectional area between the cathode-torch and three anode-nozzles.

Figure 4:
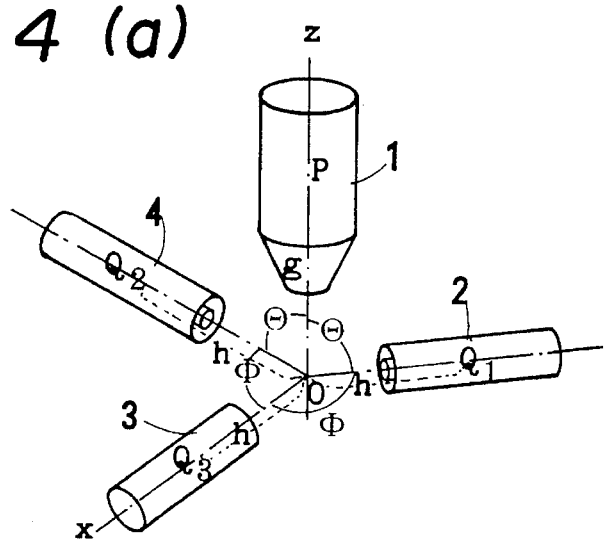
FIG. 4 is a perspective views for demonstrating modes of rotation or displacement of anode-nozzles and cathode-torch for enhancing the plasma formation area. (a) shows an initial state, (b) shows parallel transference of anode-nozzles and cathode-torch for receding from each other, and (c) shows rotations of anode-nozzles so as to induce discrepancy between extensions of anode-nozzles.
Figure 4:
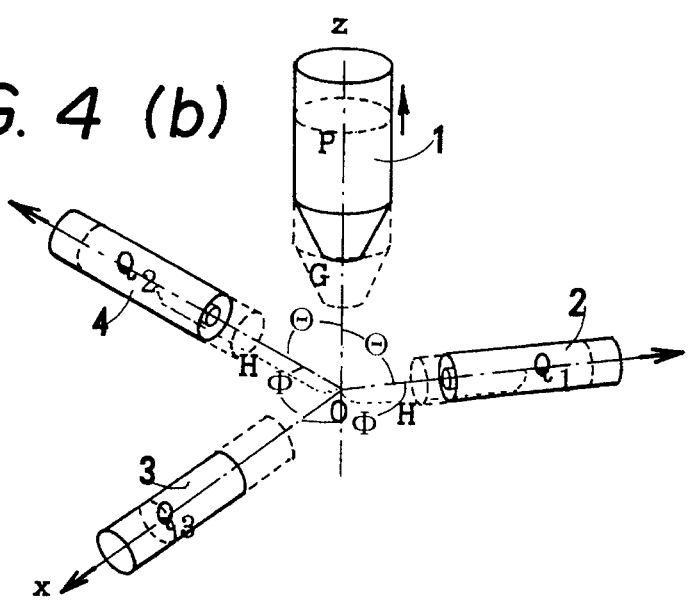
Figure 4:
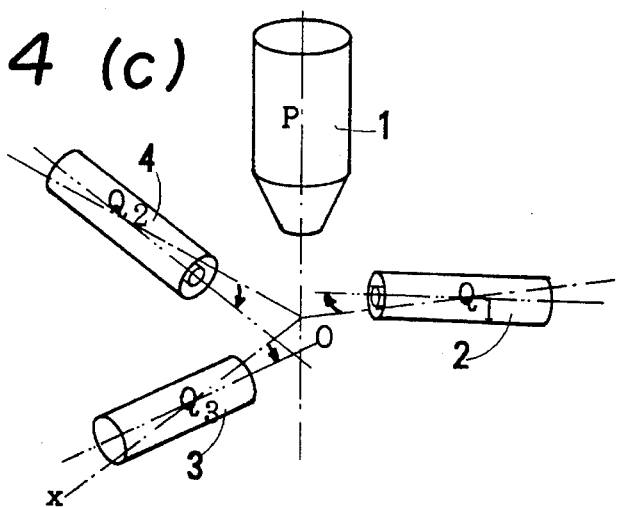

[9] This invention further enlarges the transferable, outer plasma arc jet by moving or rotating the cathode-torch or the anode-nozzles. FIG. 4 demonstrates modes of displacement of the torch and the nozzles. FIG. 4(a) shows an initial disposition of the torch and the nozzles. Upward direction is denoted by z-axis, and two horizontal directions are denoted by x-axis and y-axis. A cathode-torch (1) is installed downward along z-axis. Extensions of central lines of anode-nozzles (2), (3) and (4) meet at the same point at a right angle to z-axis on their extensions. Thus, all anode-nozzles lie on the same plane vertical to z-axis ($\Theta=90°$). The neighboring anode-nozzles meet at a 120 degree angle on the extensions ($\Phi=120°$). Several modes of displacement will be explained.

(a) parallel transference of the cathode-torch (1) for receding from the crossing point O as shown in FIG. 4(b).

(b) parallel transference of anode-nozzles (2), (3) and (4) in the directions of receding from the crossing point 0 as shown in FIG. 4(b).

(c) Inclining the anode-nozzles (2), (3) and (4) for letting the extensions of the central lines of them deviate from the initial crossing point O as shown in FIG. 4(c). Front ends incline downwards. Namely, initial directions of the anode-nozzles (2), (3) and (4) are represented by the unit vectors, $$(-\cos(2\pi i/3), -\sin(2\pi i/3), 0) \quad i=1, 2, 3 \quad (13)$$

Final directions of the anode-nozzles are represented by the unit vectors, $$(-\cos(2\pi i/3+\delta), -\sin(2\pi i/3+\delta), -\epsilon) \quad i=1, 2, 3 \quad (14)$$

Where $\delta$ and $\epsilon$ are small amounts and are not necessarily the same for all the anode-nozzles. Inclinations by $\delta$ and $\epsilon$ deviate the center lines of torches from point O.

(d) Inclination downwards of the anode-nozzles not shown figures.

Final state is expressed by the direction vectors.

$$(-\cos(2\pi i/3), -\sin(2\pi i/3), -\epsilon) \quad (15)$$

Extensions of center lines of the anode-nozzles meet at a point below O.

In these manners, the plasma formation area of outer plasma jets produced by the cathode-torch and anode-nozzles is widened by such dynamical operations. A carbon-containing gas or a mixture gas of a carbon-containing gas and hydrogen gas is supplied to the confluences of plasma jets from the cathode-torch (1) and the anode-nozzles (2), (3), and (4) by the gas supplying nozzles (5), (6) and (7).

Since operations (a) to (d) vary the plasma formation area, positions of the confluences are also displaced. The nozzles are also displaced in accordance with the variations of the confluences in order to eject a carbon-containing gas to the present confluences at all times.

[10] The pressure of the vacuum chamber (9) is reduced to about 200 Torr.

[11] A mixture gas of Ar and $H_2$ of Ar: $H_2=1:1$ in volume ratio is supplied as a plasma formation gas (19) in the passageway between the first and second outer electrodes (14) and (13).

[12] The cooled susceptor (11) on which a molybdenum substrate body (12) had been fixed to ensure enough heat transmission has once lowered at a low position in the vacuum chamber (9). The cooled susceptor (11) is gradually raised up within the arc plasma jet flame (8') from the torches. A thermocouple (not shown in figures) is buried in the molybdenum substrate (12) for measuring the temperature of the substrate body (12).

[13] The position of the cooled susceptor (11), power of plasma formation and pressure in the vacuum chamber (9) are adjusted to keep the substrate (12) in the plasma jet flame (8') and keep the surface of the substrate (12) at a temperature between about 700° C. and about 1200° C.

[14] Next, methane gas ($CH_4$) is introduced into the plasma jets from the gas supplying nozzles (5), (6) and (7) as a carbon-containing gas. Preferably the atomic ratio of carbon to hydrogen (the number of carbon atoms to the number of hydrogen atoms) in the whole reaction gas should be less than about 10%.

Addition of oxygen gas to a carbon-containing gas is also available. If oxygen is added to a carbon-containing gas to an atomic ratio of less than about 50% of oxygen to carbon (the number of oxygen atoms to the number of carbon atoms), it is allowable to raise the ratio of (carbon atoms)/(hydrogen atoms) up to about 20%. Namely, the addition of oxygen gas enables a material gas to contain higher concentration of carbon by enhancing the ability of eliminating non-diamond carbon ingredients of synthesizing diamond by the action of oxygen. If the ratio of carbon atoms increased over the limits in a carbon-containing gas, a deposited material on the substrate would contain plenty of non-diamond carbon ingredients. It is undesirable, because the deposited material is not diamond of high quality. In the disposition of the torches as shown in FIG. 4, diamond is synthesized under the conditions shown in table 1 on a substrate of a diameter of 3 inches. Only argon gas is supplied into the passageway between the cathode bar (15) and the First outer electrode (14) by a rate of 3.5 L/min. A mixture of argon gas and hydrogen gas is let flown at a flow rate of 15 L/min (Ar:$H_2$=1:1) in the other passageway between the first outer electrode (14) and the second outer electrode (13) of the cathode-torch (1). Each anode-nozzle is replenished with only argon gas of 1 L/min. The gas supplying nozzles (5), (6) and (7) gush methane gas of a 0.2 L/min flow rate.

Embodiment 1 enables us to synthesize diamond at more than about 150 μm/hr deposition speed on a 3 inch diameter substrate. The fluctuation of film thinness is less than about 10%. Raman scattering spectroscopy certifies that the synthesized film is a diamond of good quality without inclusion of non-diamond ingredients. This invention allows us to synthesize a good diamond with a wide area at a high speed.

TABLE 1

| GAS COMPONENTS (L/min) | GASES SUPPLIED TO TORCHE 1 AND NOZZLES 2, 3, 4 | | | |
|---|---|---|---|---|
| | Cathode-torch (1) | Anode-nozzle (2) | Anode-nozzle (3) | Anode-nozzle (4) |
| | 16 | 17 | 25 | 32 | 39 |
| Ar | 3.5 | 7.5 | 1.0 | 1.0 | 1.0 |
| $H_2$ | 0 | 7.5 | 0 | 0 | 0 |
| $CH_4$ | 0 | 0 | 0 | 0 | 0 |

| | GASES SUPPLIED FROM NOZZLES 5, 6, 7 NOZZLE NO. | | |
|---|---|---|---|
| | 5 | 6 | 7 |
| Ar | 0 | 0 | 0 |
| $H_2$ | 0 | 0 | 0 |
| $CH_4$ | 0.2 | 0.2 | 0.2 |

| DC POWER OF POWER SOURCES (kW) | SUPPLIED POWER TO TORCHE 1 Cathode-torch (1) |
|---|---|
| NO. | 41 |
| kW | 30 |

| PRESSURE | 200 Torr |
|---|---|
| TEMPERATURE SURFACE OF SUBSTRATE | 1000° C. |

(Numbers correspond to reference numbers of torches, gas inlets, nozzles, or power sources in the figures)

EMBODIMENT 2 (M=2, N=2)

Figure 5:
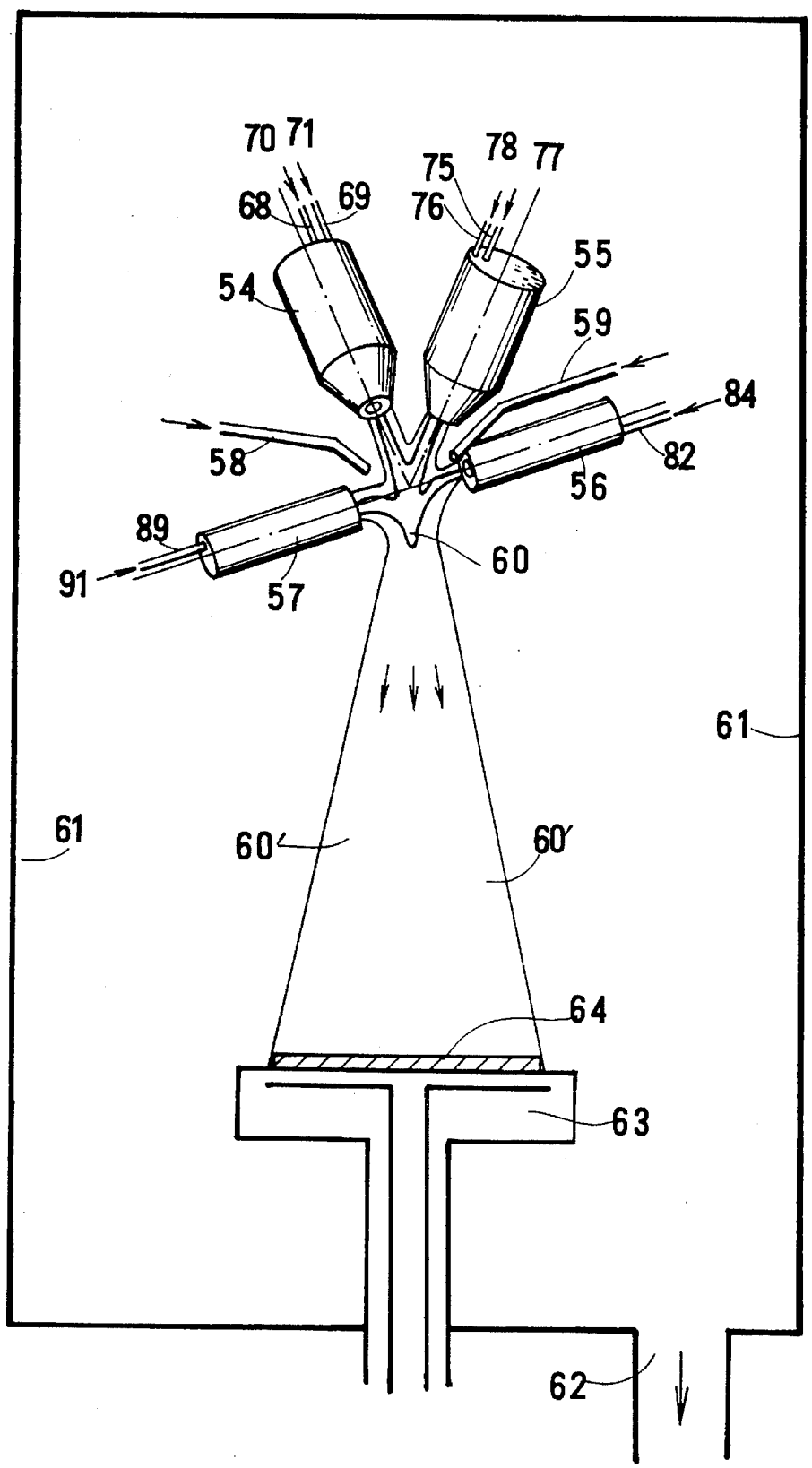
FIG. 5 is a schematic view of an apparatus of a second embodiment of this invention utilizing two cathode-torches and two anode-nozzles.

FIG. 5 shows embodiment 2 which makes use of two cathode-torches (54) and (55) and two anode-nozzles (56) and (57). Plasma torches (54) and (55) are individually able to form inner untransferable plasma jets by ejecting plasma with discharge gases from gas outlets. However, the nozzles (56) and (57) cannot make plasma are by themselves. In embodiment 2, the torches (54) and (55) will act as cathodes. Thus, the plasma torches (54) and (55) are called cathode-torches in short. On the contrary, the nozzles (56) and (57) will act as anodes. The nozzles (56) and (57) are called anode-nozzles to clarifying the function. The anode-nozzles (56) and (57) are lighter and more facile to convey than the cathode-torches (54) and (55). Thus a simple device will be enough to support and convey the anode-nozzles. Furthermore, each anode-nozzle dispenses with an inherent power source.

Gas supplying nozzles (58) and (59) supply a carbon-containing gas or a mixture gas of a carbon-containing gas and hydrogen gas to the confluences of outer arc plasma jets from the cathode-torches (54) and (55) and from the anode-nozzles and (57).

The cathode-torches (54) and (55), the anode-nozzles (56) and (57), the gas supplying nozzles (58) and (59) are installed in an upper space of the vacuum chamber (61) which can be made vacuous by a vacuum pump (not shown in figures) through a gas outlet (62). Diamond will be synthesized under a reduced pressure or atmospheric pressure. A cooled susceptor (63) on which a substrate body (64) is fixed is furnished at lower part of the vacuum chamber (61). Cooling water circulates in an inner space of the susceptor (63) for cooling and protecting the substrate body against hot plasma jets.

The cathode-torches (54) and (55) are disposed with front ends facing downward along slanting lines which meet at a point O (in FIG. 7). The anode-nozzles (56) and (57) are aligned along a horizontal line which is parallel to the surface of the substrate (64). A vertical plane including the cathode-torches (54) and (55) is perpendicular to a vertical plane including the anode-nozzles (56) and (57). The direction of the anode-nozzles (56) and (57) is assigned to x-axis. The distance between the center of cathode-torches and the crossing point O (an origin of the coordinate) is denoted by g. The positions of cathode-torches (54) and (55) are simply expressed by $$\text{cathode-torch (54) } (0, g\sin\Theta, g\cos\Theta) \quad (16)$$

$$\text{cathode-torch (55) } (0, -g\sin\Theta, g\cos\Theta) \quad (17)$$

A desirable inclination angle $\Theta$ of the cathode-torch is 0° to 45°. The directions of the cathode-torches (54) and (55) are designated by unit vectors;

$$\text{cathode-torch (54)} \rightarrow (0, -\sin\Theta, -\cos\Theta) \quad (18)$$

$$\text{cathode-torch (55)} \rightarrow (0, \sin\Theta, -\cos\Theta) \quad (19)$$

Similarly the positions of the anode-nozzles (56) and (57) are given by, $$\text{anode-nozzle (56) } (+h, 0, 0) \quad (20)$$

$$\text{anode-nozzle (57) } (-h, 0, 0) \quad (21)$$

The directions of the anode-nozzles are expressed by vectors;

$$\text{anode-nozzle (56)} \rightarrow (-1, 0, 0) \quad (22)$$

$$\text{anode-nozzle (57)} \rightarrow (+1, 0, 0) \quad (23)$$

Figure 6:
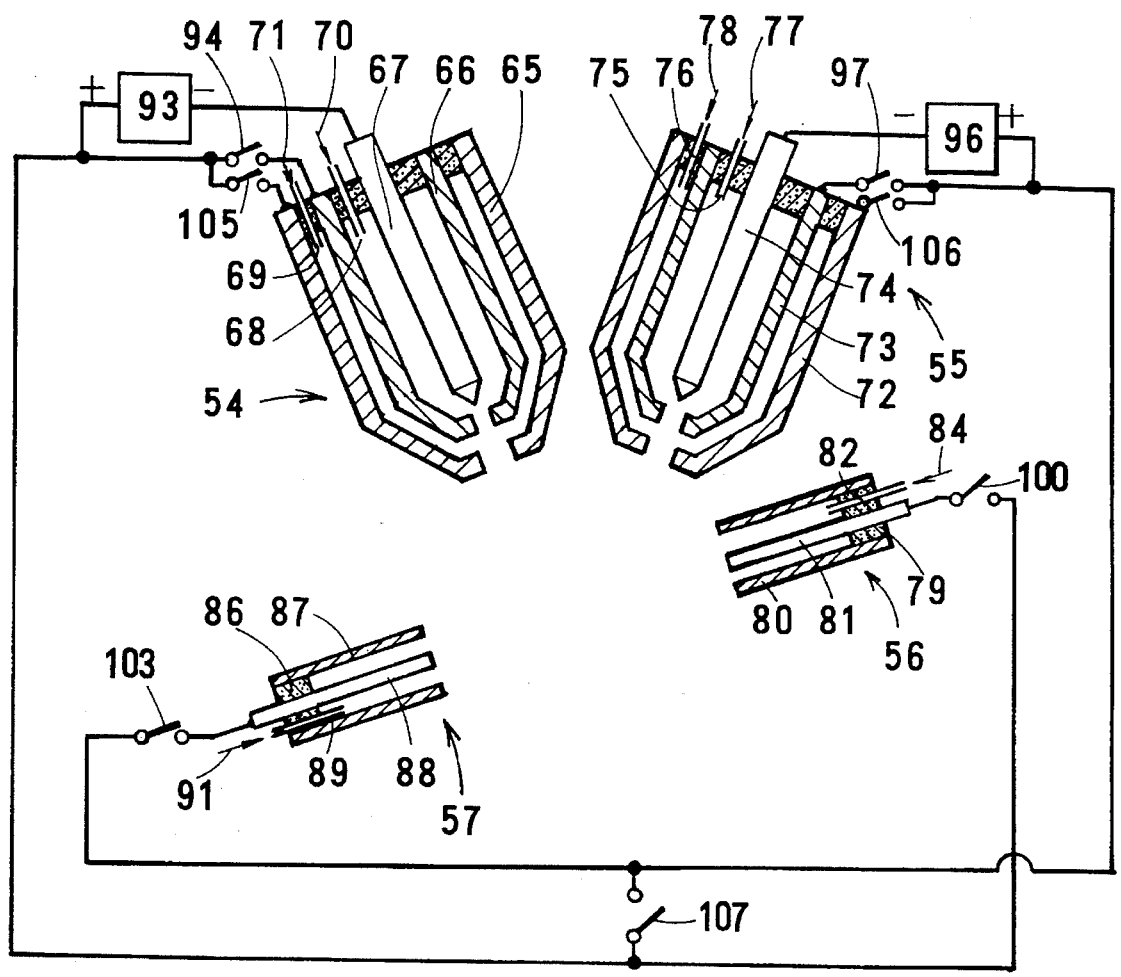
FIG. 6 is a sectional view of torches and nozzles with electric circuits for connecting torches and nozzles with power sources.

FIG. 6 exhibits a sectional view of the cathode-torches, the anode-nozzles, and the electric circuit for connecting parts of the torches, nozzles and power sources. The torches have the same structure. The cathode-torches have inherent power sources, but the anode-nozzles have no eigen power source. The cathode-torch (54) has coaxially a second outer electrode (65), a first outer electrode (66) and a cathode bar (67). The cathode bar (67) is positioned at the center and is a tungsten bar (W) which is cooled at the rear end. The outer electrodes (65) and (66) are anodes which have double walls for letting cooling water passing through the inner space. Three electrodes are electrically separated by an insulator end plate. A gas inlet (68) pierces the rear wall for supplying a plasma formation gas (70) in a passageway between the central cathode bar (67) and the first outer electrode (66).

Another gas inlet (69) pierces the rear wall for supplying a plasma formation gas (71) into a passageway between the second outer electrode (65) and the first outer electrode (66).

Similarly, the second cathode-torch (55) has a second outer electrode (72), a first outer electrode (73), a cathode bar (74) and gas inlets (75) and (76). Plasma formation gases (77) and (78) are introduced into passageways between the cathode bar (74) and outer electrodes (73) and (72) through the inlets (77) and (78).

The anode-nozzle (56) has an insulator (79) at a rear end, an outer cylinder (80) and an anode-bar (81) supported by the insulator at the ends. A gas inlet (82) penetrating the rear insulator (79) introduces plasma formation gas into an inner space held between the cylinder (80) and the anode-bar (81).

Similarly, the anode-nozzle (57) has an insulator (86), an outer cylinder (87), an anode-bar (88) and a gas inlet (89). The insulator (86) supports the outer cylinder (87), the anode-bar (88) and the gas inlet (89) at the rear ends. Plasma formation gas (91) is introduced from the gas inlet (89). The anode-nozzles have no inherent power sources. The voltage of the outer cylinders (87) and (80) are a floating level. No plasma arc is produced between the cylinder (80) or (87) and the anode-bar (81) or (88) of the anode-nozzles.

The first cathode-torch (54) is provided with a DC power source (93) which can superpose an RF voltage on a DC voltage. The negative pole of the power source (93) is connected to the cathode bar (67). Positive pole is connected via switches (94) and (105) to the first outer electrode (66) and the second outer electrode (65) respectively.

The second cathode-torch (55) is provided with a DC power source (96) which can superpose an RF voltage on a DC voltage. The negative pole of the power source (96) is connected to the cathode bar (74). The positive pole is connected via switches (97) and (106) to the first outer electrode (73) and the second outer electrode (72) respectively.

The anode bar (81) of the first anode-nozzle (56) is connected via a switch (100) to the positive pole of the power source (93) of the first cathode-torch (54). The anode bar (88) of the second anode-nozzle (57) is connected via a switch (103) to the positive pole of the power source (96) of the second cathode-torch (55).

At first, individual plasma torches (54) and (55) produce inner plasma arcs. In the step, an inert gas, e.g. Ar, He, Ne, or Kr is let flow in the passageways between the cathode bars (67) and (74), and the first outer electrodes (66) and (73).

When outer plasma arcs are formed between the cathode-torches (54) and (55) and the anode-nozzles (56) and (57), gases are let flow in other passageways between the first outer electrodes (66) and (73), and the second outer electrodes (65) and (72). A mixture gas of an inert gas and hydrogen gas is supplied to the cathode-torches (54) and (55). An inert gas is supplied to the anode-nozzles (56) and (57). In any cases, no carbon-containing gas flows in the torches (54) and (55) and the nozzles (56) and (57).

Operations of the apparatus the above-mentioned will be explained.

[1] A molybdenum (Mo) substrate body (64) of a diameter of 5 inches is tightly fixed on the cooled susceptor (63) in order to facilitate heat diffusion to cool enough the substrate body (64) against hot plasma jets. At first, the cooled susceptor (63) is lowered in the vacuum chamber (61) until the plasma jets are yielded and are stabilized. A thermocouple (not shown in figures) buried in the substrate body (64) can monitor the temperature of the substrate body (64).

[2] The vacuum chamber (61) is closed and made vacuous down to a pressure lower than about $1 \times 10^{-3}$ Torr. Ar gas is supplied to both torches (54) and (55) through all gas inlets (68), (69), (75) and (76).

[3] Switches (94) and (97) are turned on. Switches (100), (103), (105) and (106) are left off.

[4] When the pressure of the vacuum chamber (61) attains about 600 Torr, the power source (93) is actuated. An inner untransferable arc plasma jet is induced between the cathode bar (67) and the first outer electrode (66) of the first cathode-torch (54).

[5] Switch (105) is turned on. Switch (94) is turned off. The inner plasma arc is transferred to the plasma arc between the cathode bar (67) and the second outer electrode (65) of the first cathode-torch (54). The inner discharge is expanded in the torch (54).

[6] Similar operation is done to the second cathode-torch (55). The power source (96) is actuated. An inner plasma arc is induced between the cathode bar (74) and the first outer electrode (73). Switch (106) is turned on. Switch (97) is put off. The inner plasma jet is moved to another space between the cathode bar (74) and the second outer electrode (72). Namely, an inner plasma is put on in the inner space at first and is moved to the outer space. It is difficult to form an inner plasma arc therebetween without preparatory plasma. Then an inner plasma arc is put on at first between the nearer electrodes; cathode bar and first electrode, then the inner plasma arc is transferred outer.

[7] Then an outer, transferable plasma will be yielded between the cathode-torches and the anode-nozzles. The following processes can be used to form transferable, outer plasma arcs. Argon gas is replenished to the first anode-nozzle (56) and regulated. The arc plasma of the cathode-torch (54) is enlarged by raising the output power of the power source (93). Supply of argon gas to the anode-nozzle (56) is once stopped. The switch (100) is closed. The voltage of the anode bar (81) of the first anode-nozzle (56) becomes the same as the voltage of the second outer electrode (65) of the first cathode-torch (54). Voltage is now applied between the cathode bar (67) and the anode bar (81) of the first anode-nozzle (56). If necessary, the first anode-nozzle (56) should be moved nearer toward the cathode-torch (54). Then argon gas is again supplied to the first anode-nozzle (56) and the switch (105) is turned off at the same time. This operation forms an outer, transferable plasma arc between the anode bar (81) of the first anode nozzles (56) and the cathode-bar (67) of the first cathode-torch (54). Although the first anode-nozzle has no inner plasma, the outer plasma arc can be borne by catching the inner plasma arc of the cathode-torch (54).

[8] Next, another outer, transferable plasma jet will be formed between the second anode-nozzle (57) and the second cathode-torch (55) by the same processes described in [7]. Argon gas is replenished into the second anode-nozzle (57) and regulated. Power of the DC power sources (96) is gradually raised to enlarge an inner arc plasma of the cathode-torch (55). The supply of argon gas to the second anode-nozzle (57) is temporarily stopped. The switch (103) is turned on. The anode bar (88) of the second anode-nozzle (57) has the same voltage as the second outer electrode (72) of the second cathode-torch (55). Voltage is now applied between the cathode bar (74) and the anode bar (88) of the second anode-nozzle (57). If necessary, the second anode-nozzle (57) should be moved nearer toward the second cathode-torch (55). Then argon gas is again supplied to the second anode-nozzle

(57) and the switch (106) is turned off. Another transferable outer plasma arc is produced between the anode bar (88) of the second anode nozzle (57) and the cathode bar (74) of the second cathode-torch (55). Two outer plasma arcs remain between the cathode-torch (54) and the anode-nozzle (56) and between the cathode-torch (55) and the anode-nozzle (57).

[9] Two cathode-torches and two anode nozzles are relatively moved nearer toward each other. The four distances between the cathode-torches and the anode-nozzles are equal each other. The voltage of the power source (93) is kept to be equal to the bias of the power source (96). The switch (107) is turned on. This operation produces two new outer plasma arcs between the cathode-torches and the anode-nozzles. Therefore, four outer arc plasma jets are formed between two cathode-torches and two anode-nozzles. During these operations, the power sources must be adjusted so as to keep a good balance among outer plasma jets maintained by the currents supplied by the power sources and to stabilize the state of discharge.

Figure 7A:
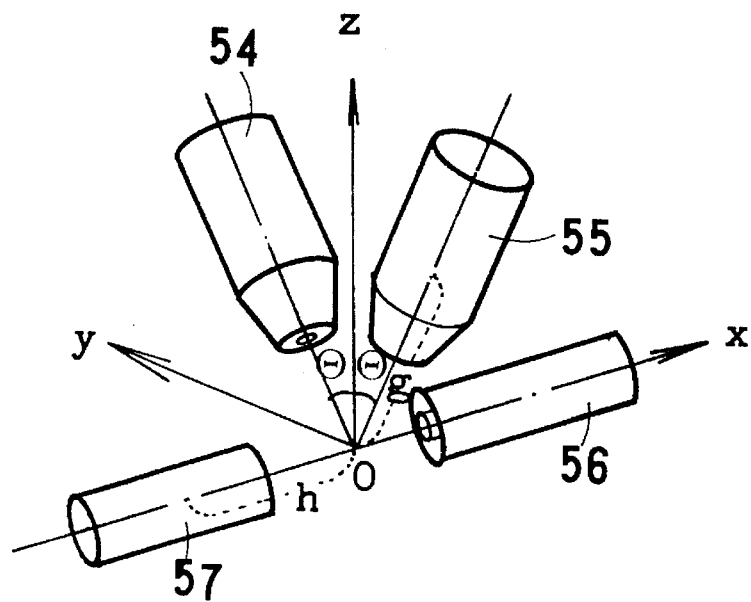
FIG. 7 is perspective views for demonstrating modes of displacement or rotation of anode-nozzles and cathode-torches for enhancing the plasma formation area. (a) shows an initial state, (b) shows recession of anode-nozzles or rotation of cathode-torches.
Figure 7B:
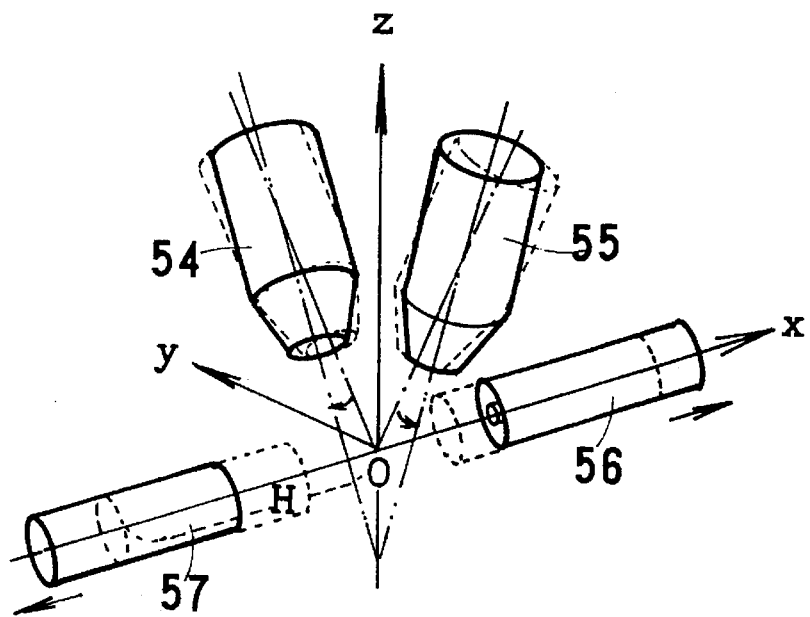

[10] These operations form a wide plasma jet by associating four outer plasma jets into one plasma jet by the geometry of the torches as shown in FIG. 5. This invention further enlarges the associated plasma jet. Some of torches and nozzles or all of torches and nozzles will be moved in parallel or rotated in the directions for enhancing the plasma formation area as shown in FIG. 7. FIG. 7(a) is an initial state. As explained before, the extensions of center lines of four torches meet at a point O (an origin of coordinate). Two cathode-torches (54) and (55) are arranged at symmetric spots on yz-plane to z-axis. Two anode-nozzles (56) and (57) lie along x-axis face to face. FIG. 7(b) demonstrates modes of movements or rotations of torches and nozzles.

(I) Cathode-torches (54) and (55) are rotated around lines parallel with x-axis so that the center lines meet at a point on z-axis below O. In the variation, the unit vectors signifying the directions of the cathode-torches (54) and (55) are expressed by $$54 \rightarrow (0, -\sin(\Theta-\Delta), -\cos(\Theta-\Delta)) \quad (24)$$

$$55 \rightarrow (0, \sin(\Theta-\Delta), -\cos(\Theta-\Delta)) \quad (25)$$

where $\Delta$ is a positive parameter. The cross point of center lines of torches lies on z-axis below 0. The z-coordinate is $$z = g \cos\Theta - g \cos(\Theta-\Delta) \quad (26)$$

(II) Anode-nozzles (56) and (57) are displaced along x-axis in the reciprocal directions for receding each other. Instead of Eqs.(20) and (21), positions of anode-nozzles (56) and (57) are denoted by $$56 \; (H, 0, 0) \quad (27)$$

$$57 \; (-H, 0, 0) \quad (28)$$

Where H>h.

(III) Cathode-torches (54) and (55) recede from 0 along the center lines. This mode is not shown in figures. By a parameter G G>g), the positions of the torches are written as $$54 \; (0, G \sin\Theta, G \cos\Theta) \quad (29)$$

$$55 \; (0, -G \sin\Theta, G \cos\Theta) \quad (30)$$

(IV) Anode-nozzles (56) and (57) are rotated around lines parallel with z-axis so as to veer the center lines from point O. Instead of (22) and (23), unit vectors of the nozzles (56) and (57) are represented by $$56 \rightarrow (-\cos\epsilon, \sin\epsilon, 0) \quad (31)$$

$$57 \rightarrow (\cos\epsilon, -\sin\epsilon, 0) \quad (32)$$

Where $\epsilon$ is an arbitrary parameter. This mode is not shown in FIG. 7(b). One or two modes of movements and rotations of two torches and two nozzles enhance the plasma formation area to great extent. This invention conspicuously features such an enlargement of plasma area.

[11] After the plasma formation area of the associated plasma jet has been enlarged by the displacement or rotations of torches and nozzles, gas supplying nozzles (58) and (59) must be also moved or rotated in order to supply a carbon-containing gas to new confluences or other optimum points of the arc plasma jet. Variation of confluences of the jets themselves induced by the displacement of the torches and nozzles requires readjustment of the gas supplying nozzles.

[12] A mixture gas of Ar: $H_2$=1:1 is introduced into the passageways between the first and second outer electrodes through the gas inlets (69) and (76) of cathode torches (54) and (55). Other passageways between the cathode bars and the first outer electrodes have been supplied only with Ar gas through the gas inlets (68) and (75) since step (2) hereto. Ar gas plays a role of protecting cathode bars (67) and (74) besides keeping plasma arcs. On the contrary, anode-nozzles (56) and (57) are supplied with only Ar gas through the gas inlets (82) and (89). Similarly, Ar gas contributes to protecting the anode bars (81) and (88) besides keeping plasma arcs.

[13] The pressure of the vacuum chamber (61) is reduced to about 200 Torr. The outer plasma jets are stably kept between torches. The cooled susceptor which has been lowered at a lower point is raised at a higher point till the substrate body comes into the plasma jet flame (60'). The height of the cooled susceptor (63), power of plasma formation, pressure of reaction shall be adjusted in order to keep the temperature of the surface of the substrate body (64) from about 700° C. to about 1200° C. by monitoring the output of the thermocouple. The position of the cooled susceptor (63) is controlled by an NC controller. As the diamond film grows thicker and thicker, the relative height of the film to the arc plasma jet changes. The decrease of the height of the plasma jet is unfavorable. The NC controller continually moves the cooled susceptor (63) so as to keep the relative position of the film surface to the plasma flame. High speed deposition of a diamond film requires such a continual adjustment.

[14] Methane gas as a carbon-containing gas is spurted from gas nozzles (58) and (59) to the arc plasma jets.

According to these operations, diamond is synthesized on a molybdenum (Mo) substrate of a diameter of 5 inches under the conditions exhibited in TABLE 2. This invention enables us to synthesize a diamond film of 5 inches in diameter on the molybdenum (Mo) substrate at a deposition speed higher than about 100 μm/hr. The fluctuation of film thickness is less than about 15% in spite of such a large width of 5 inches. The diamond is superior in the uniformity of thickness. Raman scattering spectroscopy certifies that the diamond contains little impurities; non-diamond carbon ingredients. Embodiment 2 allows us to fabricate a wide diamond film of good quality at a high speed more than about 100 μm/hr.

Figure 8:
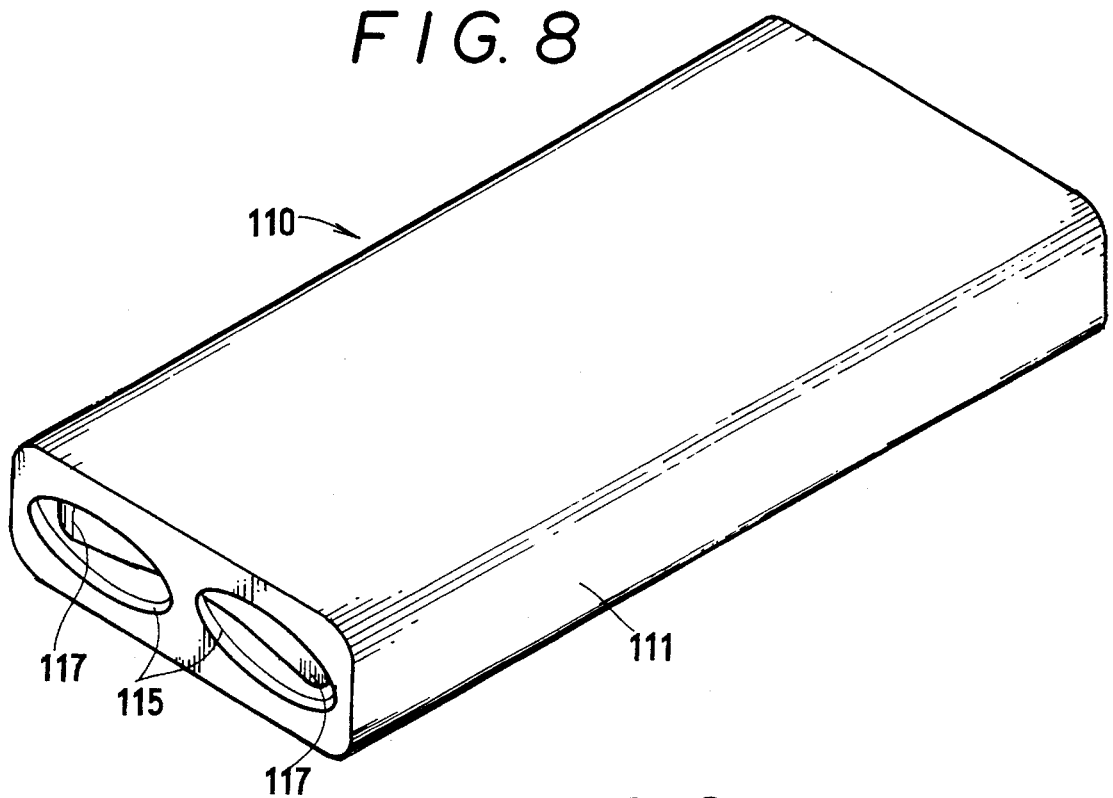
FIG. 8 is a perspective view of an example of a flat anode-nozzles.
Figure 9:
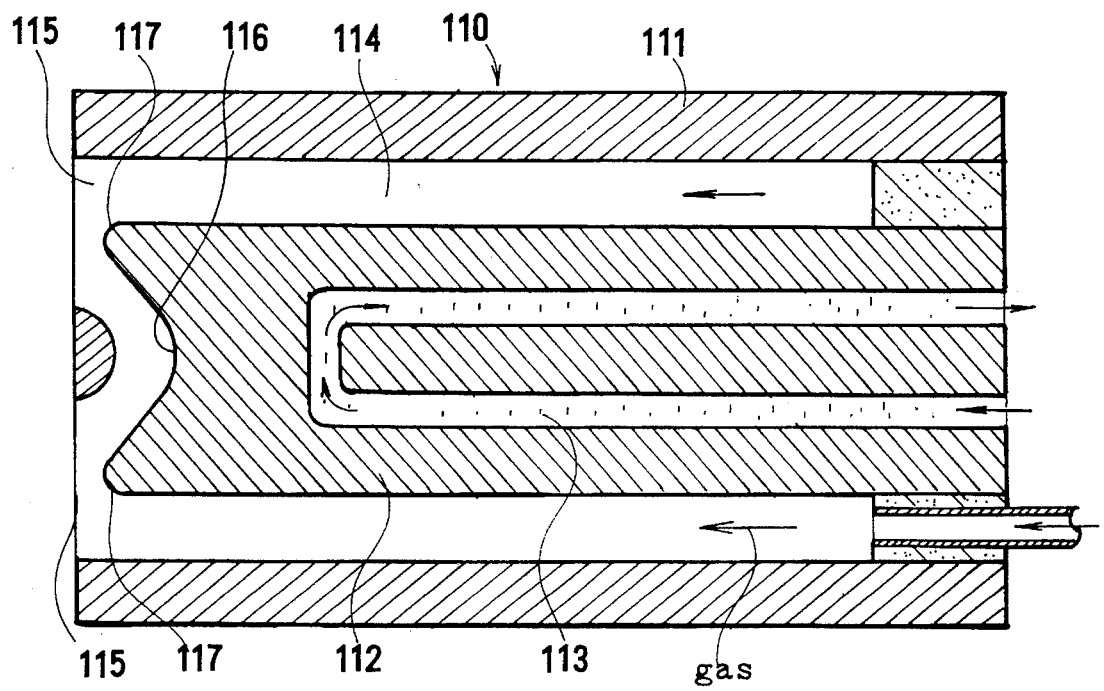
FIG. 9 is a sectional view of the anode-nozzles of FIG. 8.

Cylindrical anode-nozzles with an opening have been employed in the embodiments explained so far. However non-cylindrical anode-nozzles are also available. Further an anode-nozzle with plural openings is allowable. FIG. 8 and FIG. 9 demonstrate an example of a flat anode-nozzle. A flat anode-nozzle is preferable to cylindrical one for forming a transferable plasma arc toward a neighboring cathode-torch. In addition to the facile formation of plasma arcs, a flat anode-nozzle enjoys another advantage that a wider plasma arc can be built up thereby. The anode-nozzle (110) comprises a flat rectangular casing (111) and an flat anode bar (112). The anode bar (112) has an inner way (113) for water. Gas passageways (114) are formed between the anode bar (112) and the casing (111). Two openings (115) are perforated at the front end of the casing (111). A cavity (116) is formed at the front of the anode bar (112). Two convex points (117) are formed at the front end of the anode bar (112) behind the openings (115). The convex points facile the occurrence of plasma and stabilize the plasma discharge, because they are surely assigned to be anode-points and suppress the probable fluctuation of the anode points.

Enormous heat intake to a substrate accompanies the diamond synthesis by a DC arc plasma jet method. Effective cooling of a substrate is an important problem. The surface temperature of a substrate has an optimum range for diamond film formation. Allowable heat intake is determined by the performance of cooling device. Namely, the strength of the arc plasma is restricted by the power of the cooling device. The stronger arc plasma can activate, the more completely and faster the material gas and can synthesize diamond faster. Conventional method cooled a substrate e.g. by fixing a substrate tightly on a susceptor in favor of heat dissipation via susceptor. However, at least one boundary remains between a substrate and a susceptor. The boundary suppressed the heat conduction and restricted the cooling performance. This invention proposes a solution of the difficulty of cooling.

Figure 10:
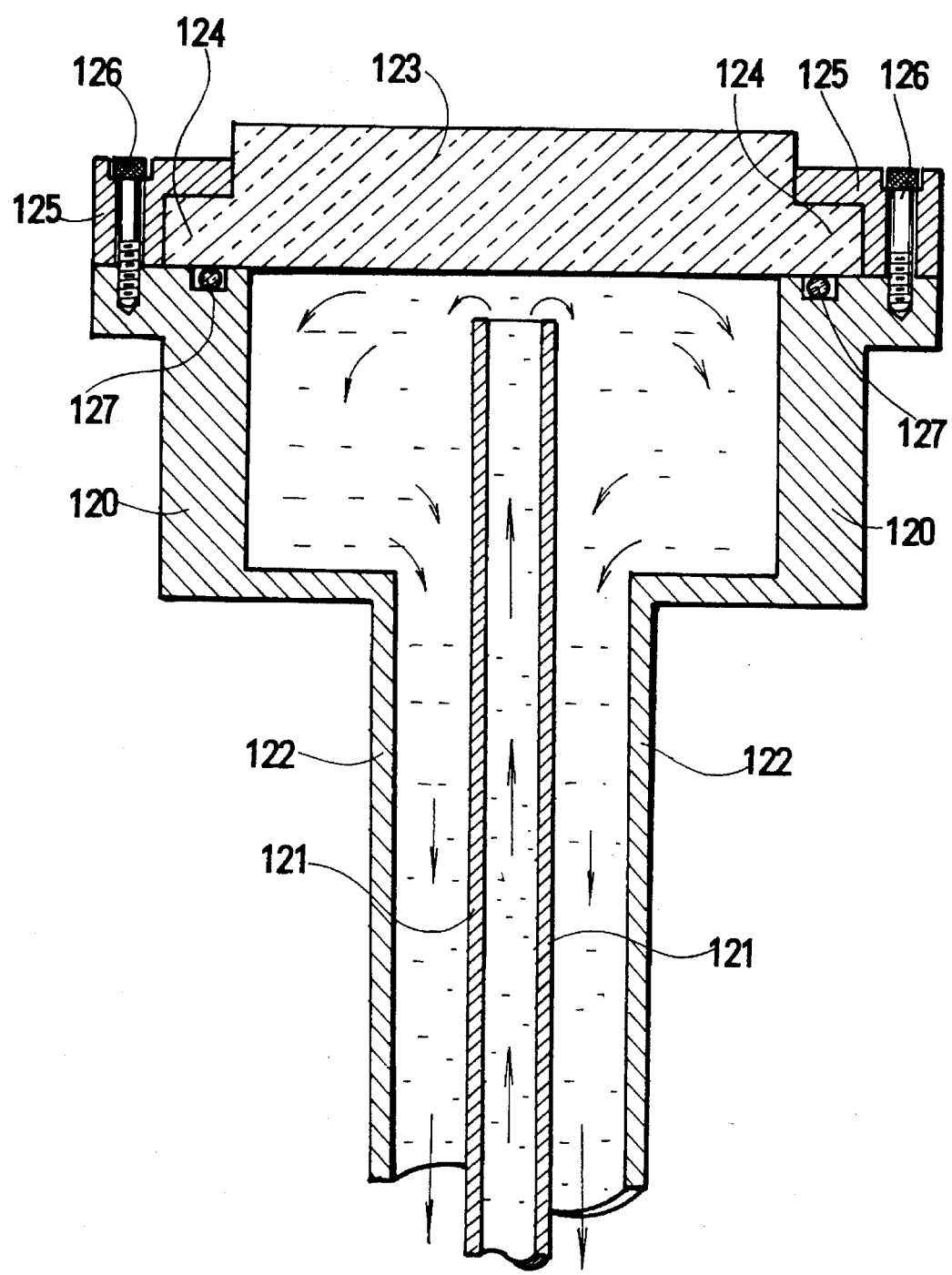
FIG. 10 is a sectional view of a substrate body supported by a susceptor.

FIG. 10 shows an advantageous mounting of a substrate. A susceptor (120) is an cylinder which lacks a top plane. An inner pipe (121) is disposed coaxially in a cylindrical susceptor column (122). A substrate (123) on which a diamond film will be deposited has an annular step (124). A ring (125) pressing the annular step (124) is fixed by screws (126) to the top periphery of the susceptor (120). An O-ring (128) is sandwiched between the substrate (123) and the susceptor (120). The substrate itself constructs a part of a susceptor. Coolant is introduced from the inner pipe (121) directly to the rear surface of the substrate (123). Direct contact of coolant to the substrate drastically enhances the cooling performance. Embodiment 1 succeeds in enhancing plasma electric power from 30 kW to 42 kW without any temperature rise by employing the cooling device shown in FIG. 10. Since the synthesis speed is in proportion to the intake power to plasma jets, the speed of synthesis is enhanced about by 50%.

TABLE 2

| GAS COMPONENTS | GASES SUPPLIED TO TORCHES 54, 55 AND NOZZLES 56, 57 VIA GAS INLETS | | | | | |
|---|---|---|---|---|---|---|
| | Cathode-torch (54) | | Cathode-torch (55) | | Anode-nozzle (56) | Anode-nozzle (57) |
| (L/min) | 70 | 71 | 77 | 78 | 84 | 91 |
| Ar | 5.0 | 10.0 | 5.0 | 10.0 | 3.0 | 3.0 |
| H$_2$ | 0 | 10.0 | 0 | 10.0 | 0 | 0 |
| CH$_4$ | 0 | 0 | 0 | 0 | 0 | 0 |

| | GASES SUPPLIED FROM NOZZLES 58, 59 | |
|---|---|---|
| | NOZZLE NO. | |
| | 58 | 59 |
| Ar | 0 | 0 |
| H$_2$ | 0 | 0 |
| CH$_4$ | 0.4 | 0.4 |

| DC POWER | SUPPLIED POWER OF TORCHES 54, 55 | |
|---|---|---|
| OF POWER SOURCES (kW) | Cathode-torch (54) | Cathode-torch (55) |
| NO. | 93 | 96 |
| kW | 24 | 24 |

| PRESSURE | 150 Torr |
|---|---|
| TEMPERATURE OF SURFACE OF SUBSTRATE | 950° C. |

What we claim is:

1. An apparatus for synthesizing diamond by dissolving and activating a material gas by DC plasma generated by a DC voltage applied between an anode and a cathode of a plasma torch and by spraying activated plasma on a substrate body comprising:

a vacuum chamber being able to be made vacuum, a vacuum pump for making the vacuum chamber vacuous, a supporter for holding the substrate body installed in the vacuum chamber, more than one cathode-torch installed in the vacuum chamber for producing a DC plasma jet, the cathode-torch having a cathode bar, outer electrodes as anodes mounted coaxially around the cathode bar, passageways among the cathode bar and the outer electrodes and gas inlets for introducing gas into the passageways, more than two anode-nozzles having an anode bar, a cylinder enclosing the anode bar and gas inlets introducing gas between the anode bar and the cylinder, plural gas supplying nozzles for spurting a carbon-containing gas or a mixture of a carbon-containing gas and hydrogen gas to the plasma jets ejected from the cathode-torches and the anode-nozzles, power sources for supplying a DC voltage or a DC voltage superposed with an RF voltage between the cathode bar and the outer electrodes of the cathode-torches or between the anode bars of the anode-nozzles and the cathode bar of the cathode-torch, connection cords for connecting the cathode-torch and the anode-nozzles to the power sources, plural switches provided in the connection cords for turning on or turning off the voltage supply to the cathode-torch or the anode-nozzles, the cathode-torch being able to form an individual inner arc plasma from the gas introduced in the passageways by applying the DC voltage between the cathode bar and the outer electrodes as anodes, any of the anode-nozzles forming an outer transferable plasma jet with some cathode-torch by applying the DC voltage between the anode bar of the anode-nozzle and the cathode bar of the cathode-torch, and all the outer transferable plasma jets being integrated into a wide unified plasma jet flame by turning on or turning off the switches.

2. An apparatus as claimed in claim 1, wherein plural cathode-torches are arranged at positions rotationally symmetric around a normal to the substrate body, extensions of the cathode-torches meet at a point O on the normal, angles held between the extensions and the normal are less than 45 degrees, the anode-nozzles are arranged at positions rotationally symmetric with the normal, extensions of the anode-nozzles meet at the same point O on the normal, and angles held between the extensions and the normal are restricted within an extent between 10 degrees and 110 degrees.

3. An apparatus as claimed in claim 1, wherein the number of the cathode-torches is equal to the number of the anode-nozzles, the cathode-torches are arranged at positions rotationally symmetric around a normal to the substrate body, extensions of the cathode-torches meet at a point O on the normal, angles held between the extensions and the normal are less than 45 degrees, the anode-nozzles are arranged at positions rotationally symmetric with the normal, extensions of the anode-nozzles meet at the same point O on the normal, angles held between the extensions and the normal are restricted within an extent between 10 degrees and 110 degrees, any anode-nozzle is distanced by the same length from two neighbouring cathode-torches, and outer transferable plasma arc jets are held between the neighbouring cathode-torches and the anode-nozzles.

4. An apparatus as claimed in claim 1, wherein the susceptor has no top wall, the substrate body is fitted to the susceptor without leakage by a ring fixed to the susceptor by screws, and the substrate body is cooled directly by coolant.

5. An apparatus as claimed in claim 1, wherein the cooling susceptor is movable in a vertical direction by an NC controller, the height of the susceptor is adjusted by the NC controller so as to maintain the same position with regard to the plasma jet flame during diamond film formation.

6. An apparatus as claimed in claim 1, wherein each anode-nozzle has an outer cylinder, an anode bar, an insulator for supporting the anode bar and the cylinder in coaxial relation and a gas inlet for introducing gas into a space between the anode bar and the cylinder, the outer cylinder is biased to the ground level or the floating level, and the anode bar is protected by inhaled inert gas from hot plasma.

7. An apparatus as claimed in claim 1, wherein the anode-nozzle has a flat, rectangular case and a flat electrode provided in the case, the case has two openings at a front end, and the inner electrode has two convexes at a front end behind the openings.

8. An apparatus for synthesizing diamond by dissolving and activating a material gas by DC plasma generated by a DC voltage applied between an anode and a cathode of a plasma torch and by spraying activated plasma on a substrate body comprising:

a vacuum chamber being able to be made vacuum, a vacuum pump for making the vacuum chamber vacuous, a supporter for holding the substrate body installed in the vacuum chamber, more than one cathode-torch installed in the vacuum chamber for producing a DC plasma jet, the cathode-torch having a cathode bar, outer electrodes as anodes mounted coaxially around the cathode bar, passageways among the cathode bar and the outer electrodes and gas inlets for introducing gas into the passageways, a device for moving or rotating the cathode-torch, more than two anode-nozzles having an anode bar, a cylinder enclosing the anode bar and gas inlets introducing gas between the anode bar and the cylinder, a device for moving or rotating the anode-nozzles, plural gas supplying nozzles for spurting a carbon-containing gas or a mixture of a carbon-containing gas and hydrogen gas to the plasma jets ejected from the cathode-torches and the anode-nozzles.

a device for moving or rotating the gas supplying nozzles, power sources for supplying a DC voltage or a DC voltage superposed with an RF voltage between the cathode bar and the outer electrode of the cathode-torch or between the anode bars of the anode-nozzles and the cathode bar of the cathode-torch, connection cords for connecting the cathode-torch and the anode-nozzles to the power sources, plural switches provided in the connection cords for turning on or turning off the voltage supply to the cathode-torch or the anode-nozzles.

the cathode-torch being able to form an individual inner arc plasma from the gas introduced in the passageways by applying the DC voltage between the cathode bar and the outer electrodes as anodes, any of the anode-nozzles forming an outer transferable plasma jet with some cathode-torch by applying the DC voltage between the anode bar of the anode-nozzle and the cathode bar of the cathode-torch, all the outer transferable plasma jets being integrated into a wide unified plasma jet flame by turning on or turning off of the switches, and the unified plasma jets being enlarged by moving or rotating the anode-nozzles or the cathode-torch.

9. An apparatus as claimed in claim 8, wherein the cathode-torches are arranged at positions rotationally symmetric around a normal to the substrate body, extensions of the cathode-torches meet at a point O on the normal, angles held between the extensions and the normal are less than 45 degrees, the anode-nozzles are arranged at positions rotationally symmetric with the normal, extensions of the anode-nozzles meet at the same point O on the normal, and angles held between the extensions and the normal are restricted within an extent between 10 degrees and 110 degrees.

10. An apparatus as claimed in claim 8, wherein the number of the cathode-torches is equal to the number of the anode-nozzles, the cathode-torches are arranged at positions rotationally symmetric around a normal to the substrate body, extensions of the cathode-torches meet at a point O on the normal, angles held between the extensions and the normal are less than 45 degrees, the anode-nozzles are arranged at positions rotationally symmetric with the normal, extensions of the anode-nozzles meet at the same point O on the normal, angles held between the extensions and the normal are restricted within an extent between 10 degrees and 110 degrees, any anode-nozzle is distanced by the same length from two neighboring cathode-torches, and outer transferable plasma arc jets are held between the neighbouring cathode-torches and the anode-nozzles.

11. An apparatus as claimed in claim 8, wherein the anode-nozzle has a flat, rectangular case and a flat electrode provided in the case, the case has two openings at a front end, and the inner electrode has two convexes at a front end behind the openings.

* * * * *